United States Patent
Yin et al.

(10) Patent No.: US 12,268,097 B2
(45) Date of Patent: Apr. 1, 2025

(54) TOP-INTERCONNECTION METAL LINES FOR A MEMORY ARRAY DEVICE AND METHODS FOR FORMING THE SAME

(71) Applicant: Taiwan Semiconductor Manufacturing Company Limited, Hsinchu (TW)

(72) Inventors: Yu-Feng Yin, Hsinchu (TW); Tai-Yen Peng, Hsinchu (TW); An-Shen Chang, Jubei (TW); Qiang Fu, Hsinchu (TW); Chung-Te Lin, Taiwan (TW); Han-Ting Tsai, Kaoshiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/336,430

(22) Filed: Jun. 16, 2023

(65) Prior Publication Data

US 2023/0329123 A1 Oct. 12, 2023

Related U.S. Application Data

(62) Division of application No. 17/224,309, filed on Apr. 7, 2021, now Pat. No. 11,723,284.

(Continued)

(51) Int. Cl.
*H10N 50/10* (2023.01)
*H01L 23/528* (2006.01)
(Continued)

(52) U.S. Cl.
CPC ......... *H10N 50/10* (2023.02); *H01L 23/5283* (2013.01); *H10B 61/22* (2023.02); *H10N 50/01* (2023.02); *H10N 50/80* (2023.02)

(58) Field of Classification Search
CPC ........ H01L 23/5283; H01L 21/823475; H10B 61/22; H10N 50/80; H10N 50/01
See application file for complete search history.

(56) References Cited

U.S. PATENT DOCUMENTS

2006/0194430 A1* 8/2006 Beck ................. H01L 21/76838
257/E21.582
2016/0020249 A1 1/2016 Ko et al.
(Continued)

FOREIGN PATENT DOCUMENTS

KR 20180065071 A 6/2018
KR 20190135903 12/2019
KR 20200066559 A 6/2020

*Primary Examiner* — Shih Tsun A Chou
(74) *Attorney, Agent, or Firm* — The Marbury Law Group, PLLC

(57) ABSTRACT

A memory array device includes an array of memory cells located over a substrate, a memory-level dielectric layer laterally surrounding the array of memory cells, and top-interconnection metal lines laterally extending along a horizontal direction and contacting a respective row of top electrodes within the memory cells. Top electrodes of the memory cells are planarized to provide top surfaces that are coplanar with the top surface of the memory-level dielectric layer. The top-interconnection metal lines do not extend below the horizontal plane including the top surface of the memory-level dielectric layer, and prevent electrical shorts between the top-interconnection metal lines and components of memory cells.

20 Claims, 25 Drawing Sheets

Related U.S. Application Data

(60) Provisional application No. 63/039,529, filed on Jun. 16, 2020.

(51) Int. Cl.
*H10B 61/00* (2023.01)
*H10N 50/01* (2023.01)
*H10N 50/80* (2023.01)

(56) References Cited

U.S. PATENT DOCUMENTS

| | | | |
|---|---|---|---|
| 2018/0308899 A1* | 10/2018 | Chuang | H10N 50/01 |
| 2019/0006381 A1 | 1/2019 | Nakatsuji et al. | |
| 2019/0165258 A1* | 5/2019 | Peng | H10N 50/10 |
| 2020/0106008 A1 | 4/2020 | Peng et al. | |

* cited by examiner

TOP-INTERCONNECTION METAL LINES FOR A MEMORY ARRAY DEVICE AND METHODS FOR FORMING THE SAME

RELATED APPLICATIONS

This application is a divisional application of U.S. patent application Ser. No. 17/224,309 entitled "Top-Interconnection Metal Lines for a Memory Array Device and Methods for Forming the Same," filed on Apr. 7, 2021, which claims the benefit of priority from U.S. Provisional Application No. 63/039,529 entitled "Semiconductor Structure and Method for Manufacturing the Same," filed on Jun. 16, 2020, the entire contents of both of which are hereby incorporated by reference for all purposes.

BACKGROUND

Some types of memory devices include patterned layer stacks of different materials. Electrical shorts between the materials of the patterned layer stacks ought to be mitigated in order to provide functional memory devices.

BRIEF SUMMARY OF THE INVENTION

According to an aspect of the present disclosure, a method of manufacturing a memory array device is provided, which comprises; forming an array of memory cells over a substrate by depositing and patterning a memory material layer stack, wherein each of the memory cells comprises, from bottom to top, a bottom electrode, a memory element, and a top electrode; forming a memory-level dielectric layer around the array of memory cells; planarizing the top electrodes of the array of memory cells by removing portions of the top electrodes from above a horizontal plane located above bottom surfaces of the top electrodes; and forming top-interconnection metal lines by depositing and patterning a conductive material above the memory-level dielectric layer, wherein the top-interconnection metal lines are formed on, or replaces, a respective row of top electrodes within the memory cells.

According to another aspect of the present disclosure, a method of forming a memory array device is provided, which comprises: forming an array of memory cells located over a substrate, wherein each of the memory cells comprises, from bottom to top, a bottom electrode, a memory element, and a top electrode; forming a memory-level dielectric layer around the array of memory cells, wherein a top surface of the memory-level dielectric layer is formed within a horizontal plane including top surfaces of the top electrodes; forming an upper-level etch stop dielectric layer over the memory-level dielectric layer; forming a dielectric matrix layer over the upper-level etch stop dielectric layer; and forming top-interconnection metal lines over the array of memory cells, wherein each of the top-interconnection metal lines contacts, or replaces, a respective row of top electrodes.

According to yet another aspect of the present disclosure, a method of forming a memory array device is provided, which comprises: forming an array of memory cells located over a substrate, wherein each of the memory cells comprises, from bottom to top, a bottom electrode, a memory element, and a top electrode; forming an array of dielectric spacers such that each of the dielectric spacers laterally surrounds a respective one of the memory cells; forming a layer stack of an upper-level etch stop dielectric layer and at least one dielectric matrix layer over the array of memory cells; and forming top-interconnection metal lines through the layer stack such that each of the top-interconnection metal lines contacts, or replaces, a respective row of top electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
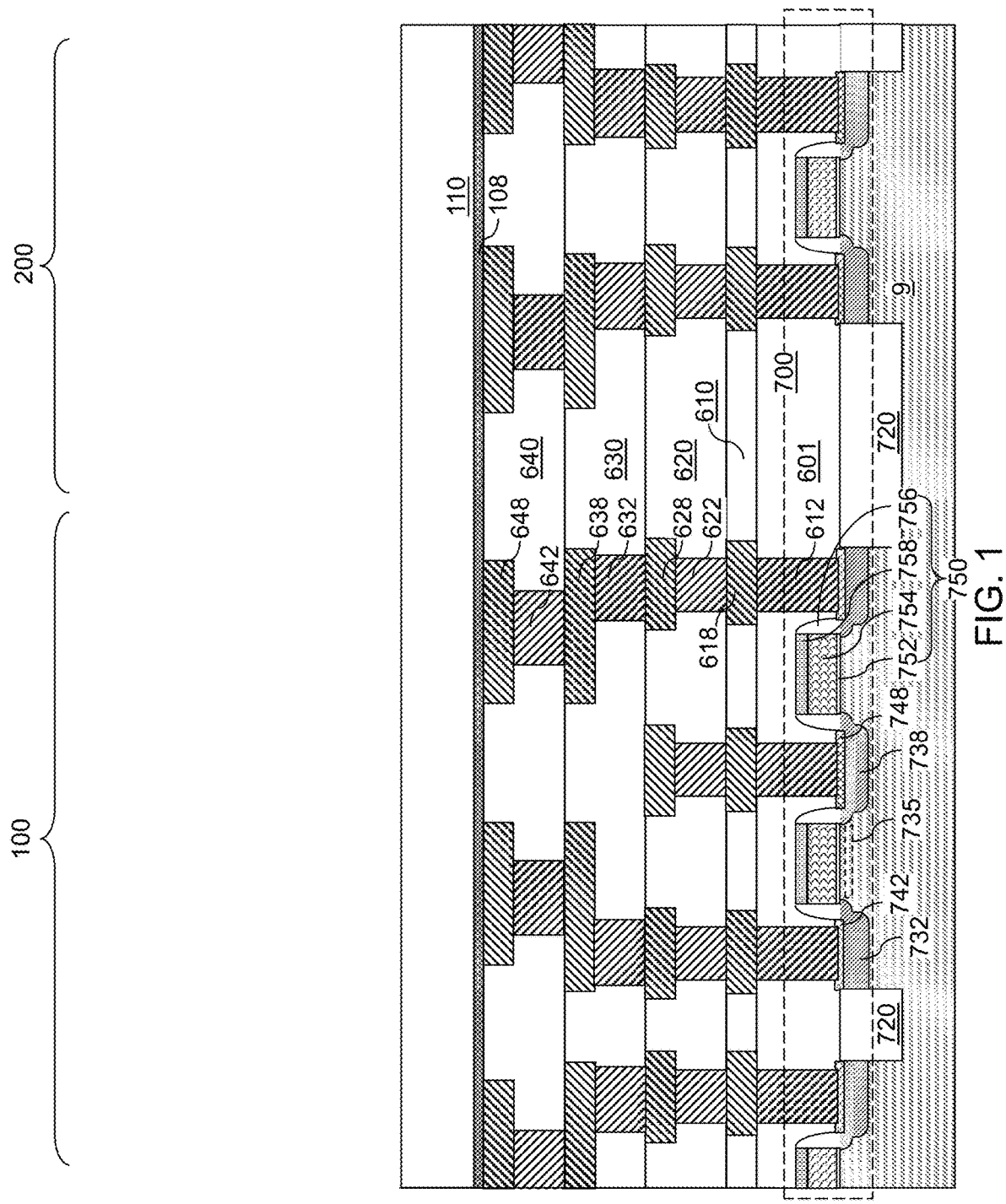
FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a memory cell and/or an array of memory cells. Specifically, the structures and methods of the present disclosure may be used to form a magnetic tunnel junction memory cell and/or an array of magnetic tunnel junction memory cells. While the present disclosure is described using an exemplary structure including magnetic tunnel junction memory cells, the methods of the present disclosure may be used to form any memory cell or any array of memory cells including a vertical stack of patterned material portions that constitutes a memory cell and containing a top electrode.

Integrated circuit and discrete device designs seek to minimize the size, power consumption while maximizing speed and performance. As device dimensions grow increasingly smaller, it becomes difficult to form a contact via structure on a memory cell without electrical shorts (i.e., unintended electrical connection of structures and nodes). For example, as the device dimensions shrink, the top electrode of a memory device becomes smaller that the landing via. As the top electrode becomes increasingly smaller than the landing via, the memory device becomes at risk for damage due to landing via punch through. The present disclosure provides a magnetic tunnel junction array device using a chemical mechanical planarizing process that planarizes top electrodes, and forms top-interconnection metal lines that contact a respective row of top electrodes. The top-interconnection metal lines may be formed directly on a respective row of top electrodes of the memory cells and do not extend below the top electrodes. Thus, various embodiments provide for top electrode contact structures that may prevent landing via punch through and may protect underlying structures from collateral structural damages during manufacturing. Specifically, top contact structures are formed as top-interconnection metal lines on top of top electrodes. Thus, electrical contacts to the top electrodes may be formed without inducing electrical shorts between the various material layers of the magnetic tunnel junctions and higher yield for magnetic tunnel junction devices may be achieved.

FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure. Referring to FIG. 1, an exemplary structure according to an embodiment of the present disclosure is illustrated. The exemplary structure includes complementary metal-oxide-semiconductor (CMOS) transistors and metal interconnect structures formed in dielectric material layers. Specifically, the exemplary structure includes a substrate 9, which may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAAFET) transistors, or any other type of field effect transistors (FETs).

The exemplary structure may include a memory array region 100 in which an array of memory elements may be subsequently formed, and a peripheral region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Devices (such as field effect transistors) in the peripheral region 200 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures embedded in dielectric material layers may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 may include source lines that are connected to a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells is formed over the fourth line-and-via-level dielectric material layer 640, embodiments are expressly contemplated herein in which the array of memory cells may be formed at a different metal interconnect level.

The dielectric material layers (601, 610, 620, 630, 640) may be located at a lower level relative to an array of memory cells to be subsequently formed. As such, the dielectric material layers (601, 610, 620, 630, 640) are herein referred to as lower-level dielectric layers, i.e., dielectric material layer located at a lower level relative to the array of memory cells to be subsequently formed. The metal interconnect structures (612, 618, 622, 628, 632, 638, 642, 648) are herein referred to lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

A dielectric cap layer 108 and a connection-via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630, 640). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extends throughout the memory array region 100 and the peripheral region 200.

Figure 2:
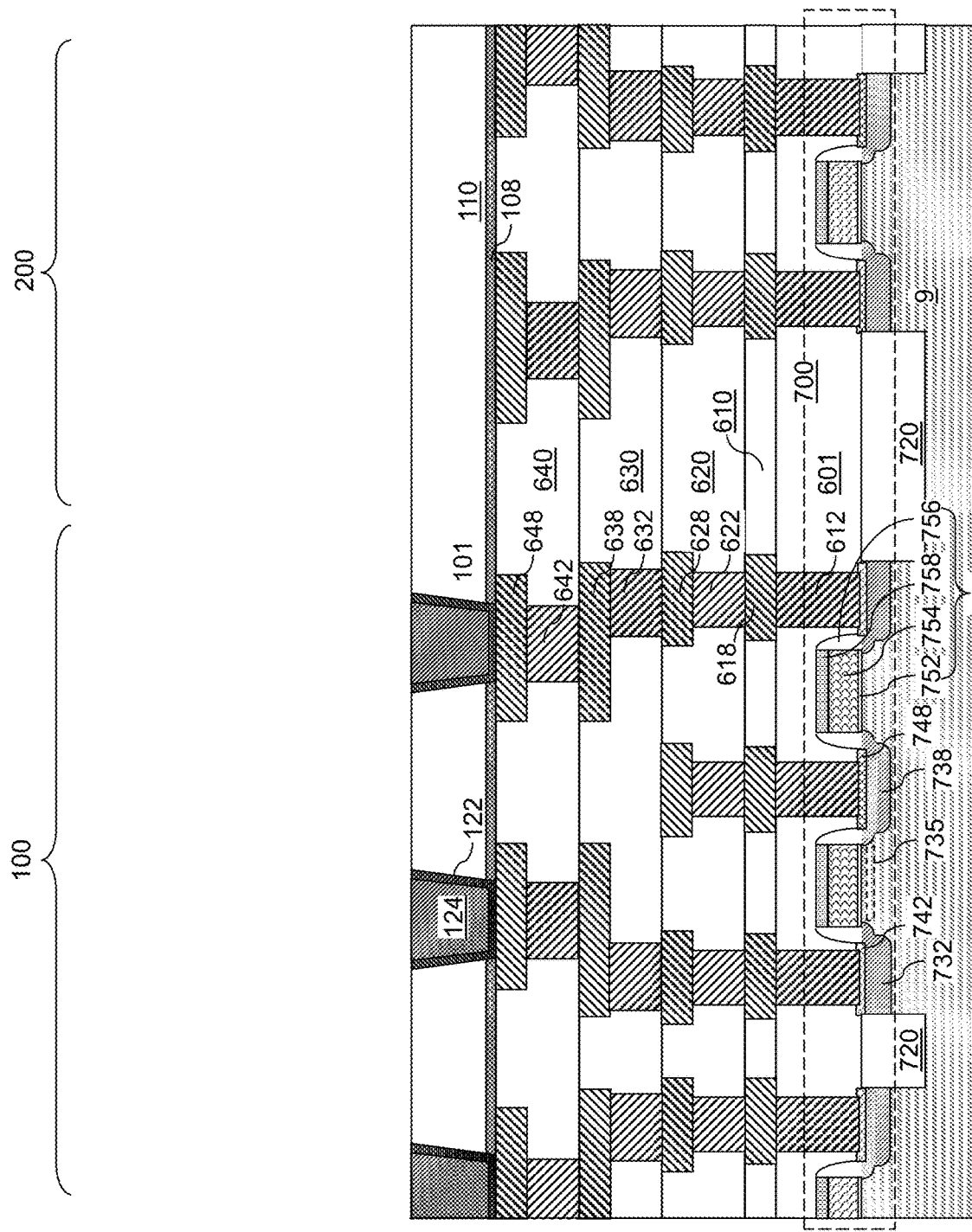
FIG. 2 is a vertical cross-sectional view of the exemplary structure after formation of an array of connection via structures according to an embodiment of the present disclosure.

FIG. 2 is a vertical cross-sectional view of the exemplary structure after formation of an array of connection via structures according to an embodiment of the present disclosure. Referring to FIG. 2, via cavities may be formed through the connection-via-level dielectric layer 110 and the dielectric cap layer 108. For example, a photoresist layer (not shown) may be applied over the connection-via-level dielectric layer 110 and may be patterned to form opening within areas of the memory array region 100 that overlie a respective one of the fourth metal line structures 648. An anisotropic etch may be performed to transfer the pattern in the photoresist layer through the connection-via-level dielectric layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (with respect to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 648, tapered sidewalls of the lower-electrode-contact via cavities, and the top surface of the connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 110 may be removed by a planarization process such as chemical mechanical planarization to form. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric layer 110 on underlying metal interconnect structures. The array of connection via structures (122, 124) may contact top surfaces of a subset of the fourth metal line structures 648. Generally, the array of connection via structures (122, 124) contacts top surfaces of a subset of lower-level metal lines located at the topmost level of the lower-level dielectric layers (601, 610, 620, 630, 640).

Figure 3:
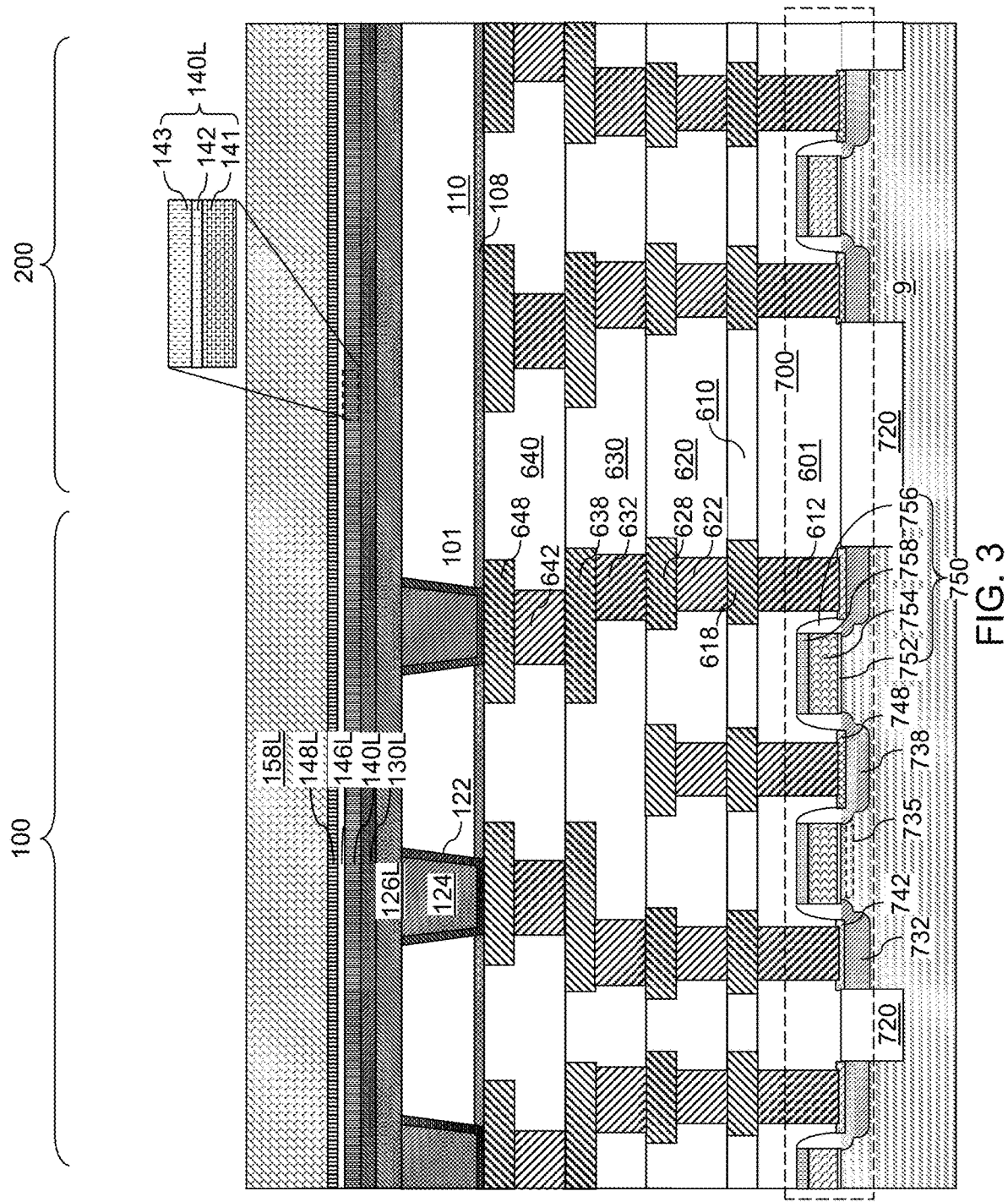
FIG. 3 is a vertical cross-sectional view of the exemplary structure after formation of a bottom electrode material layer, a memory material layer stack, and a top electrode material layer according to an embodiment of the present disclosure.

FIG. 3 is a vertical cross-sectional view of the exemplary structure after formation of a bottom electrode material layer, a memory material layer stack, and a top electrode material layer according to an embodiment of the present disclosure. Referring to FIG. 3, a bottom electrode material layer 126L, a memory material layer stack (130L, 140L, 146L, 148L), and a top electrode material layer 158L may be formed over the connection-via-level dielectric layer 110 and the array of connection via structures (122, 124).

The bottom electrode material layer 126L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the bottom electrode material layer 126L may be in a range from 10 nm to 100 nm, although lesser and greater thicknesses may also be used.

In one embodiment, the memory material layer stack (130L, 140L, 146L, 148L) may include, from bottom to top, an optional nonmagnetic metallic buffer material layer 130L, a synthetic antiferromagnet layer 140L, a nonmagnetic tunnel barrier material layer 146L, and a free magnetization material layer 148L. The layers within the memory material layer stack (130L, 140L, 146L, 148L) may be deposited by a respective chemical vapor deposition process or a respective physical vapor deposition process. Each layer within the memory material layer stack (130L, 140L, 146L, 148L) may be deposited as planar blanket material layers having a respective uniform thickness throughout. Generally, the memory material layer stack (130L, 140L, 146L, 148L) is formed between the bottom electrode material layer 126L and the top electrode material layer 158L.

The nonmagnetic metallic buffer material layer 130L includes a nonmagnetic material that may function as a seed layer. Specifically, the nonmagnetic metallic buffer material layer 130L may provide a template crystalline structure that aligns polycrystalline grains of the materials of the synthetic antiferromagnet layer 140L along directions that maximizes the magnetization of a reference layer within the synthetic antiferromagnet layer 140L. The nonmagnetic metallic buffer material layer 130L may include Ti, a CoFeB alloy, a NiFe alloy, ruthenium, or a combination thereof. Other suitable materials are within the contemplated scope of disclosure. The thickness of the nonmagnetic metallic buffer material layer 130L may be in a range from 3 nm to 30 nm, although lesser and greater thicknesses may also be used.

The synthetic antiferromagnet (SAF) layer 140L may include a layer stack of a ferromagnetic hard layer 141, an antiferromagnetic coupling layer 142, and a reference magnetization layer 143. Each of the ferromagnetic hard layer 141 and the reference magnetization layer 143 may have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 may include a hard ferromagnetic material such as PtMn, IrMn, RhMn, FeMn, OsMn, etc. The reference magnetization layer 143 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 may include ruthenium or iridium. The thickness of the antiferromagnetic coupling layer 142 may be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the SAF layer 140L can be determined by matching the magnitude of the magnetization of the ferromagnetic hard layer 141 with the magnitude of the magnetization of the reference magnetization layer 143. The thickness of the SAF layer 140L may be in a range from 5 nm to 30 nm, although lesser and greater thicknesses may also be used.

The nonmagnetic tunnel barrier material layer 146L may include a tunneling barrier material, which may be an electrically insulating material having a thickness that allows electron tunneling. For example, the nonmagnetic tunnel barrier material layer 146L may include magnesium oxide (MgO), aluminum oxide ($Al_2O_3$), aluminum nitride (AlN), aluminum oxynitride (AlON), hafnium oxide ($Hf_2$) or zirconium oxide ($ZrO_2$) Other suitable materials within the contemplated scope of disclosure may also be used. The thickness of the nonmagnetic tunnel barrier material layer 146L may be 0.7 nm to 1.3 nm, although lesser and greater thicknesses may also be used.

The free magnetization material layer 148L includes a ferromagnetic material having two stable magnetization directions that are parallel or antiparallel to the magnetization direction of the reference magnetization layer 143. The free magnetization material layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 148L may be in a range from 1 nm to 6 nm, although lesser and greater thicknesses may also be used.

The top electrode material layer 158L includes a top electrode material, which may include any nonmagnetic material that may be used for the bottom electrode material layer 126L. Exemplary metallic materials that may be used for the top electrode material layer 158L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode material layer 158L may include, and/or may consist essentially of, an elemental metal such as W, Cu, Ti, Ta, Ru, Co, Mo, or Pt. The thickness of the top electrode material layer 158L may be in a range from 8 nm to 80 nm, such as from 16 nm to 40 nm, although lesser and greater thicknesses may also be used. In one embodiment, the top electrode material layer 158L may have a homogenous material composition throughout.

While the present disclosure is described using an embodiment in which the memory material layers include the nonmagnetic metallic buffer material layer 130L, the synthetic antiferromagnet layer 140L, the nonmagnetic tunnel barrier material layer 146L, and the free magnetization material layer 148L, the methods and structures of the present disclosure may be applied to any structure in which the memory material layers include a different layer stack provided between a bottom electrode material layer 126L and a top electrode material layer 158L and include material layers that may store information in any manner. Modifications of the present disclosure are expressly contemplated herein in which the memory material layers include a phase change memory material, a ferroelectric memory material, or a vacancy-modulated conductive oxide material.

Figure 4:
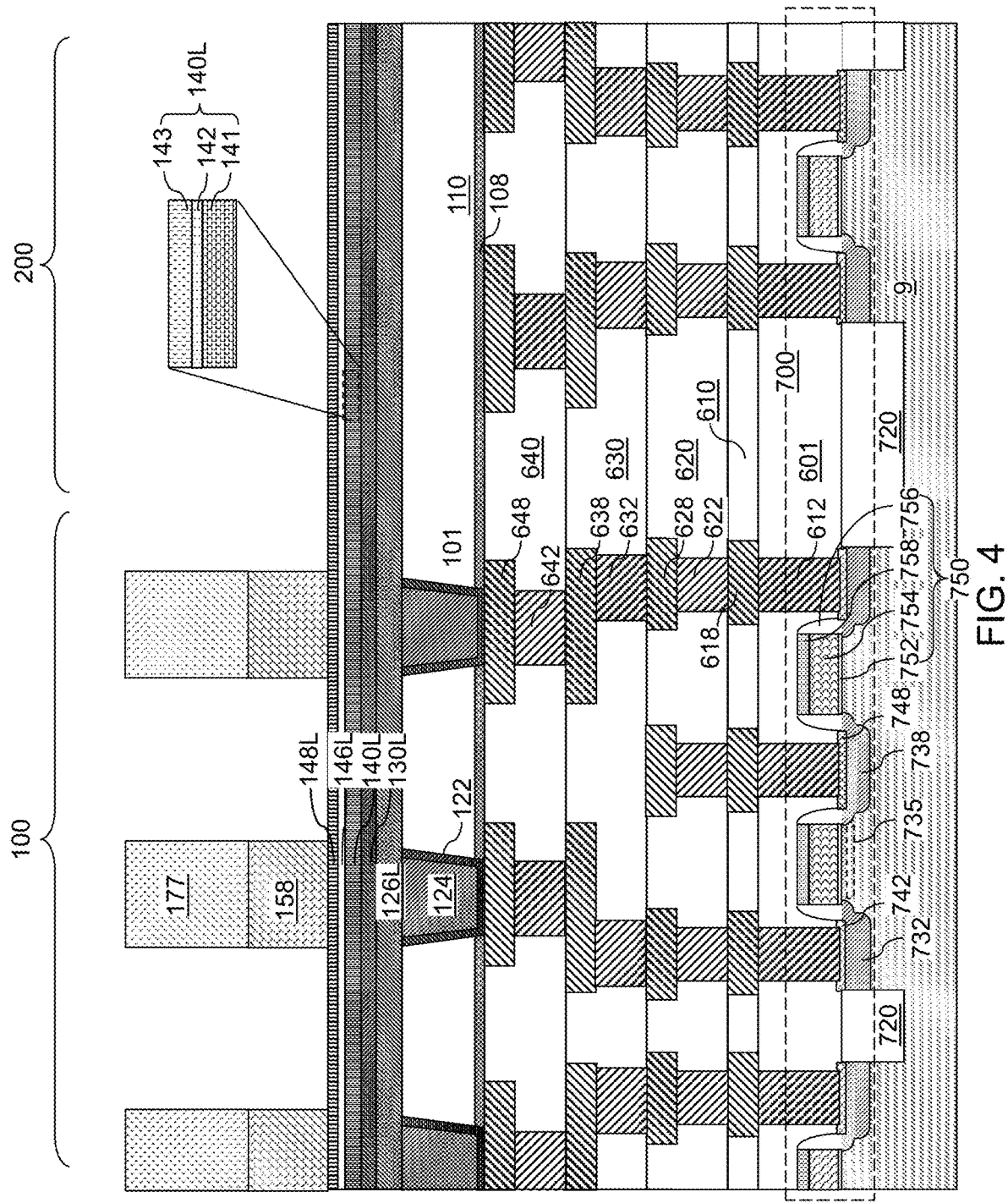
FIG. 4 is a vertical cross-sectional view of the exemplary structure after patterning the top electrode material layer into top electrodes according to an embodiment of the present disclosure.

FIG. 4 is a vertical cross-sectional view of the exemplary structure after patterning the top electrode material layer into top electrodes according to an embodiment of the present disclosure. Referring to FIG. 4, a photoresist layer 177 may be applied over the top electrode material layer 158L, and may be lithographically patterned into an array of discrete photoresist material portions in the memory array region 100. Each patterned portion of the photoresist layer 177 may overlie a respective one of the connection via structures (122, 124). The sidewall(s) of each patterned portion of the photoresist layer 177 may coincide with, may be laterally offset outward from, or may be laterally offset inward from, the periphery of a top surface of an underlying connection via structure (122, 124). The sidewall(s) of each patterned portion of the photoresist layer 177 may have a horizontal cross-sectional shape of a circle, an ellipse, a rectangle, a rounded rectangle, or of any generally curvilinear closed two-dimensional shape.

A first anisotropic etch process may be performed to etch unmasked portions of the top electrode material layer 158L. In one embodiment, the topmost layer of the memory material layer stack (130L, 140L, 146L, 148L) may be used as an etch stop layer. Each patterned portion of the top electrode material layer 158L comprises a top electrode 158. A two-dimensional array of top electrodes 158 may be formed by the anisotropic etch process. In one embodiment, the two-dimensional array of top electrodes 158 may be formed as a two-dimensional periodic array. In one embodiment, the two-dimensional periodic array of top electrodes 158 may be formed as a rectangular periodic array having a first pitch along a first horizontal direction and having a second pitch along a second horizontal direction that is perpendicular to the first horizontal direction. The photoresist layer 177 may be removed after the first anisotropic etch process, or may remain on the two-dimensional array of top electrodes 158 during a subsequent second anisotropic etch process.

Figure 5:
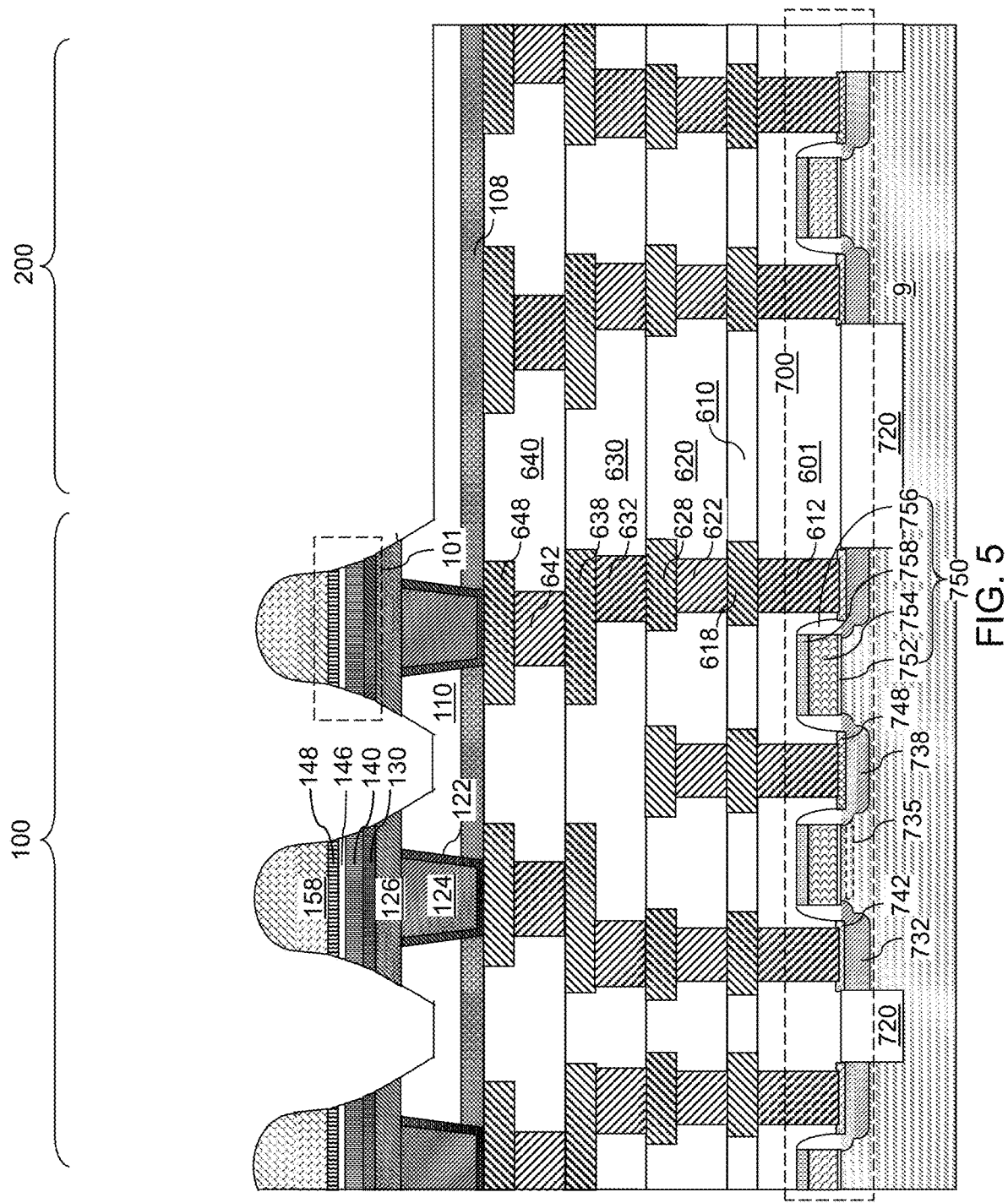
FIG. 5 is a vertical cross-sectional view of the exemplary structure after formation of an array of memory cells according to an embodiment of the present disclosure.

FIG. 5 is a vertical cross-sectional view of the exemplary structure after formation of an array of memory cells according to an embodiment of the present disclosure. Referring to FIG. 5, a second anisotropic etch process may be performed to transfer the pattern of the two-dimensional array of top electrodes 158 (or the pattern of the two-dimensional array of patterned photoresist material portions) through the memory material layer stack (130L, 140L, 146L, 148L) and the bottom electrode material layer 126L. Portions of the memory material layer stack (130L, 140L, 146L, 148L) and the bottom electrode material layer 126L that are not masked by the two-dimensional array of top electrodes 158 are etched during the second anisotropic etch process. In embodiments in which the photoresist layer 177 is present at the beginning of the second anisotropic etch process, the photoresist layer 177 may be collaterally consumed during the second anisotropic etch process, and the two-dimensional array of top electrodes 158 may be used as an etch mask at least during patterning of the bottom electrode material layer 126L. Alternatively, in embodiments in which the photoresist layer 177 is removed prior to the second anisotropic etch process, the two-dimensional array of top electrodes 158 may be used as an etch mask throughout the second anisotropic etch process.

The second anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be used. Unmasked portions of the connection-via-level dielectric layer 110 may be vertically recessed by the second anisotropic etch process. In an alternative embodiment, an ion milling process may be used in lieu of the second anisotropic etch process.

Generally, the top electrode material layer 158L, the memory material layer stack (130L, 140L, 146L, 148L), and the bottom electrode material layer 126L may be patterned in a two-dimensional periodic array of stacks of memory cells (126, 101, 158). Each memory cell (126, 101, 158) may include a vertical stack including a top electrode 158, a memory element 101, and a bottom electrode 126.

In one embodiment, each memory cell (126, 101, 158) may be a magnetic tunnel junction (MTJ) memory cell. Each MTJ memory cell may include a bottom electrode 126, a magnetic tunnel junction structure (140, 146, 148), and a top electrode 158. Each memory element 101 may include an optional nonmagnetic metallic buffer layer and a magnetic tunnel junction structure (140, 146, 148).

Each magnetic tunnel junction (140, 146, 148) may include a synthetic antiferromagnet (SAF) structure 140, a nonmagnetic tunnel barrier layer 146, and a free magnetization layer 148. A nonmagnetic metallic buffer layer 130 may be provided between the bottom electrode 126 and the magnetic tunnel junction (140, 146, 148). Each bottom electrode 126 is a patterned portion of the bottom electrode material layer 126L. Each SAF structure 140 is a patterned portion of the SAF layer 140L. Each nonmagnetic tunnel barrier layer 146 is a patterned portion of the nonmagnetic tunnel barrier material layer 146L. Each free magnetization layer 148 is a patterned portion of the free magnetization material layer 148L. The synthetic antiferromagnetic structure 140 may include a layer stack of a ferromagnetic hard layer 141, an antiferromagnetic coupling layer 142, and a reference magnetization layer 143. Generally, in embodiments in which each memory element 101 comprises a magnetic tunnel junction memory element, each memory element 101 may comprise a reference magnetization layer 143, a nonmagnetic tunnel barrier layer 146 in contact with the reference magnetization layer 143, and a free magnetization layer 148 in contact with the nonmagnetic tunnel barrier layer 146.

Each top electrode 158 may be a patterned portion of the top electrode material layer 158L. In one embodiment, the top electrodes 158 comprise, and/or consist essentially of, a conductive metallic nitride material (such as TiN, TaN, or WN), and each of the memory elements 101 comprises a vertical stack including a synthetic antiferromagnet structure 140, a nonmagnetic tunnel barrier layer 146, and a free magnetization layer 148.

The array of connection via structures (122, 124) may be located underneath the array of memory cells (126, 101, 158), and may contact a bottom surface of a respective one of the bottom electrodes 128. Portions of the connection-via-level dielectric layer 110 that are not covered by the two-dimensional array of memory cells (126, 101, 158) may be vertically recessed below the horizontal plane including the interfaces between the array of connection via structures (122, 124) and the array of memory cells (126, 101, 158). The remaining portions of the connection-via-level dielectric layer 110 may include a recessed horizontal top surface that is adjoined to bottom peripheries of tapered sidewalls of portions of the connection-via-level dielectric layer 110 that underlie the array of memory cells (126, 101, 158).

Figure 6:
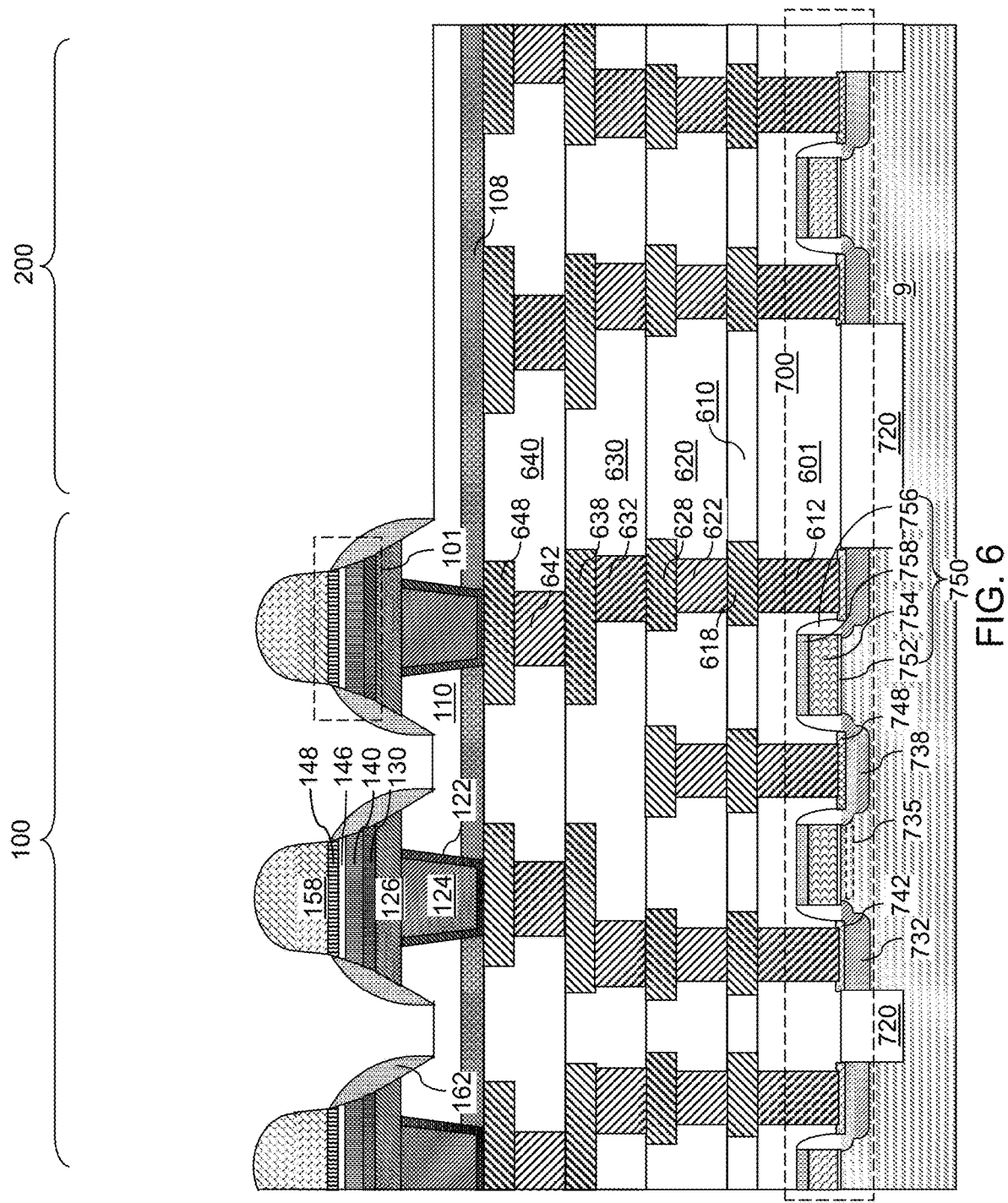
FIG. 6 is a vertical cross-sectional view of the exemplary structure after formation of an array of inner dielectric spacer portions according to an embodiment of the present disclosure.

FIG. 6 is a vertical cross-sectional view of the exemplary structure after formation of an array of inner dielectric spacer portions according to an embodiment of the present disclosure. Referring to FIG. 6, a first dielectric material such as silicon nitride may be conformally deposited over the array of memory cells (126, 101, 158). For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be used. An anisotropic etch process may be performed to remove horizontal portions of the first dielectric material. Remaining portions of the first dielectric material comprise an array of inner dielectric spacer portions 162 that laterally surrounds the array of memory cells (126, 101, 158). In one embodiment, the duration of the anisotropic etch process may be selected such that sidewalls of the top electrodes 158 are partly or fully physically exposed. The maximum thickness of each inner dielectric spacer portion 162 may be in a range from 2 nm to 20 nm, such as from 4 nm to 10 nm, although lesser and greater thicknesses may also be used.

Figure 7:
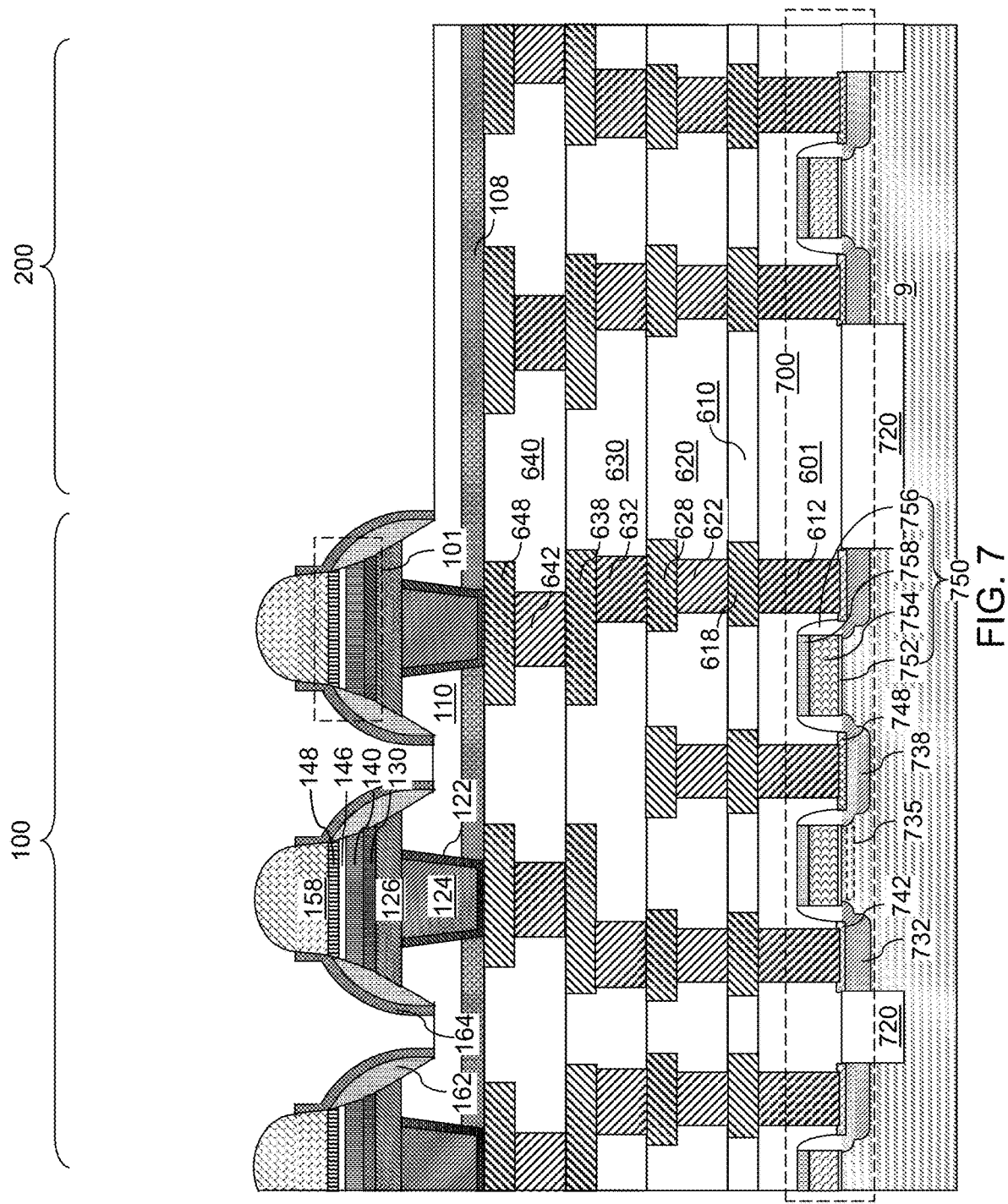
FIG. 7 is a vertical cross-sectional view of the exemplary structure after formation of an array of outer dielectric spacer portions according to an embodiment of the present disclosure.

FIG. 7 is a vertical cross-sectional view of the exemplary structure after formation of an array of outer dielectric spacer portions according to an embodiment of the present disclosure. Referring to FIG. 7, a second dielectric material such as a dielectric metal oxide may be conformally deposited over the array of inner dielectric spacer portions 162. For example, the second dielectric material may include aluminum oxide, hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be used. An anisotropic etch process may be performed to remove horizontal portions of the second dielectric material. Remaining portions of the second dielectric material comprise an array of outer dielectric spacer portions 164 that laterally surrounds the array of inner dielectric spacer portions 162. In one embodiment, the outer dielectric spacer portions 164 may be deposited directly on sidewalls of the top electrodes 158. In one embodiment, each sidewall of the top electrodes 158 may contact a respective outer dielectric spacer portion 164. The maximum thickness of each outer dielectric spacer portion 164 may be in a range from 2 nm to 20 nm, such as from 4 nm to 10 nm, although lesser and greater thicknesses may also be used.

Each combination of an inner dielectric spacer portion 162 and an outer dielectric spacer portion 164 constitutes a dielectric spacer (162, 164). An array of dielectric spacers (162, 164) laterally surrounds the array of memory cells (126, 101, 158). While the present disclosure is described using an embodiment in which a dielectric spacer (162, 164) includes an inner dielectric spacer portion 162 and an outer dielectric spacer portion 164, embodiments are expressly contemplated herein in which a dielectric spacer consists of an inner dielectric spacer portion 162 or consists of an outer dielectric spacer portion 164. Generally, an array of dielectric spacers (162, 164) may be formed around the array of memory cells (126, 101, 158). Each dielectric spacer (162, 164) may be formed directly on, and around, a sidewall of a respective memory cell (126, 101, 158).

Figure 8:
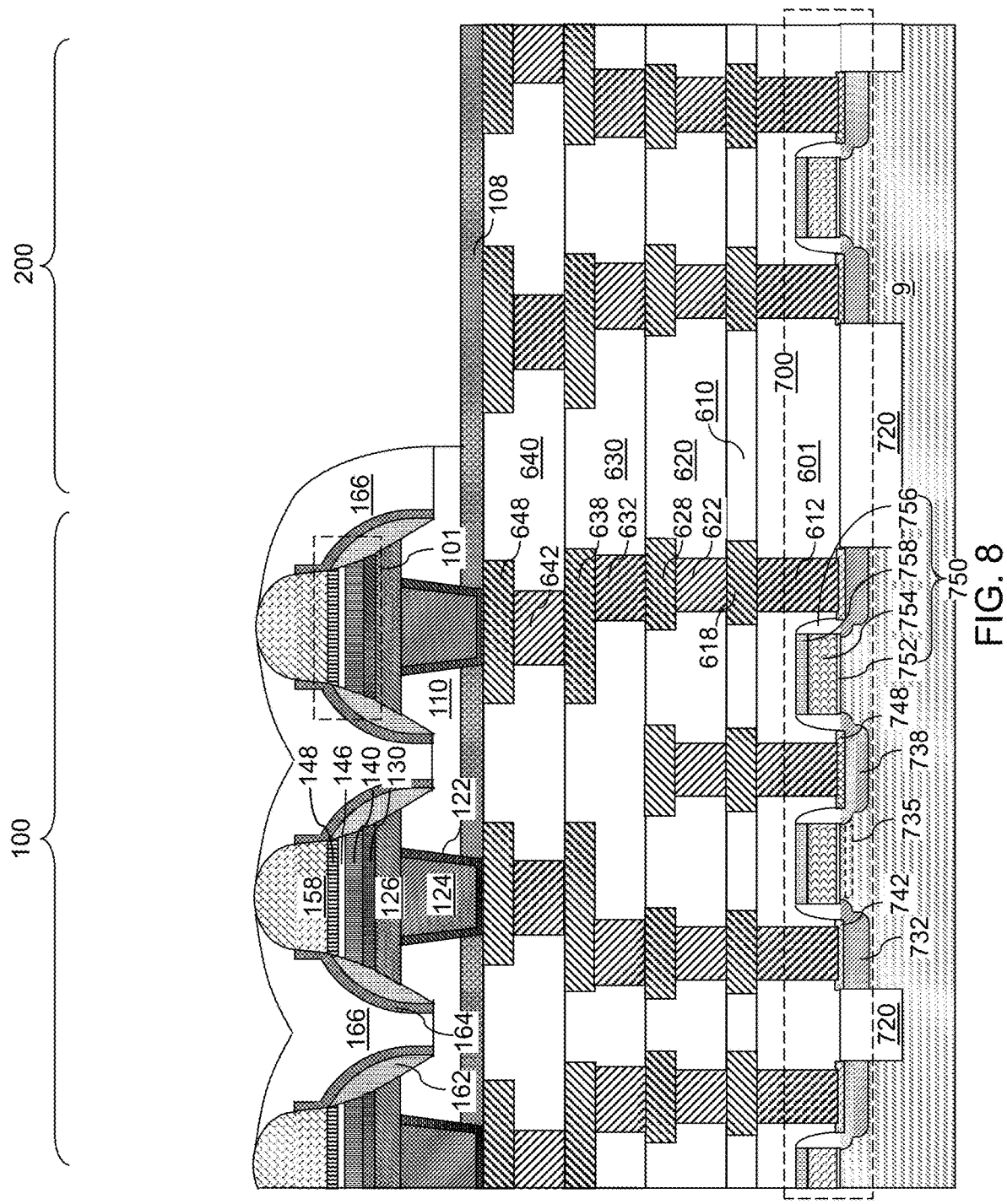
FIG. 8 is a vertical cross-sectional view of the exemplary structure after formation of a dielectric encapsulation structure according to an embodiment of the present disclosure.

FIG. 8 is a vertical cross-sectional view of the exemplary structure after formation of a dielectric encapsulation structure according to an embodiment of the present disclosure. Referring to FIG. 8, a dielectric encapsulation material such as silicon oxide, silicon nitride, or a dielectric metal oxide may be deposited by a conformal deposition process such as an atomic layer deposition process or a chemical vapor deposition process, and may be subsequently anisotropically etched to form a dielectric encapsulation structure 166. In one embodiment, the dielectric encapsulation structure 166 may include silicon oxide. In one embodiment, the thickness of the dielectric encapsulation material may be selected such that volumes between neighboring pairs of memory cells (126, 101, 158) are filled with the dielectric encapsulation material in the memory array region 100. In one embodiment, the top surface of the dielectric encapsulation structure 166 may be located above the horizontal plane including the topmost surfaces of the dielectric spacers (162, 164) between each neighboring pair of memory cells (126, 101, 158). In one embodiment, the anisotropic etch process that removes horizontally-extending portions of the dielectric encapsulation material may etch the portion of the connection-via-level dielectric layer 110 in areas that do not underlie the array of memory cells (126, 101, 158) or the dielectric encapsulation structure 166. In this embodiment, the portion of the connection-via-level dielectric layer 110 located in the peripheral region 200 may be removed by the anisotropic etch process.

Figure 9:
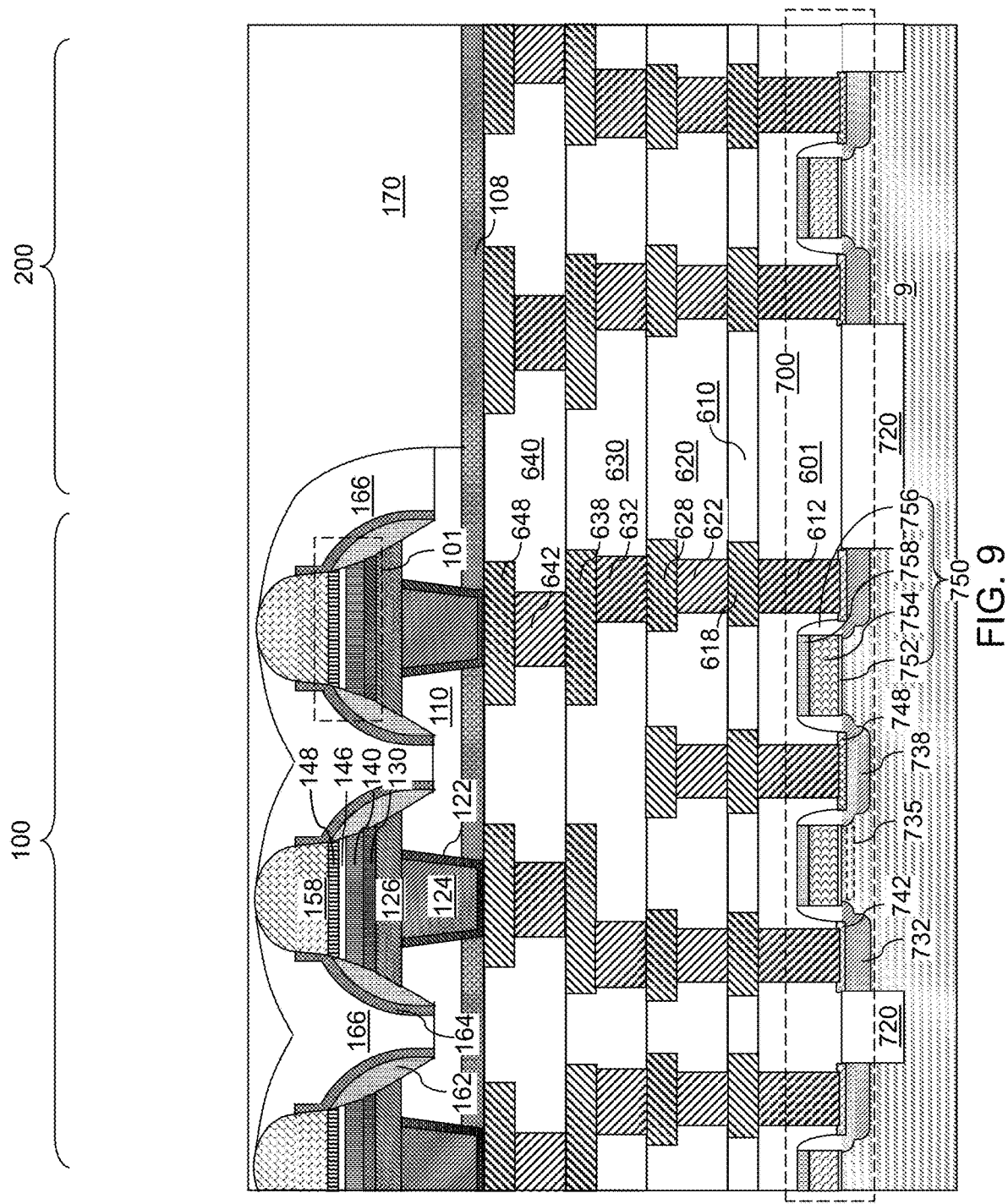
FIG. 9 is a vertical cross-sectional view of the exemplary structure after formation of a memory-level dielectric layer according to an embodiment of the present disclosure.

FIG. 9 is a vertical cross-sectional view of the exemplary structure after formation of a memory-level dielectric layer according to an embodiment of the present disclosure. Referring to FIG. 9, a memory-level dielectric layer 170 may be formed around, and over, the array of dielectric spacers (162, 164) and the dielectric encapsulation structure 166 and over the dielectric cap layer 108. The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating).

Figure 10:
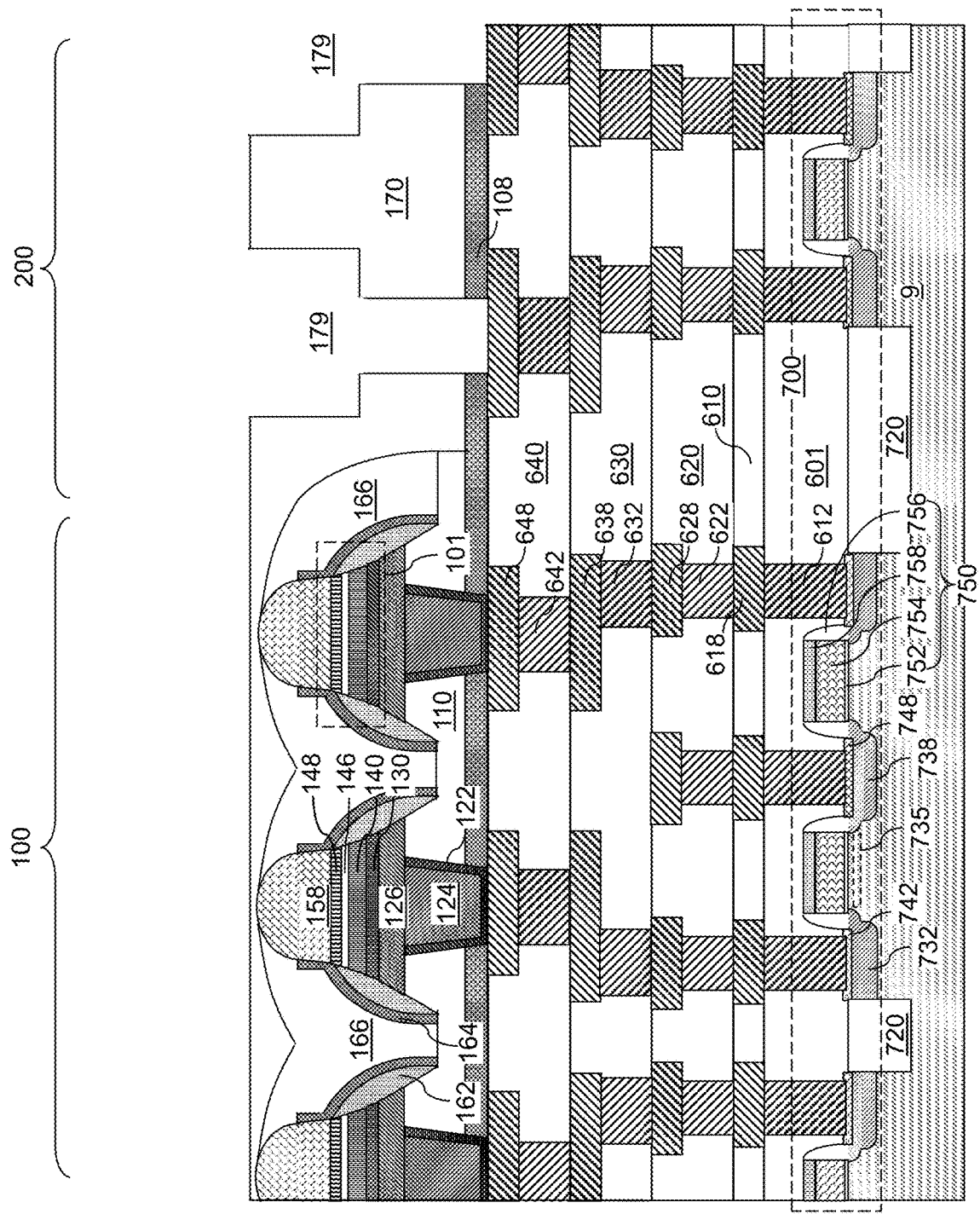
FIG. 10 is a vertical cross-sectional view of the exemplary structure after formation of integrated line and via cavities through the memory-level dielectric layer according to an embodiment of the present disclosure.

FIG. 10 is a vertical cross-sectional view of the exemplary structure after formation of integrated line and via cavities through the memory-level dielectric layer according to an embodiment of the present disclosure. Referring to FIG. 10, at least one lithographic patterning step and at least one anisotropic etch process may be used for form interconnect cavities 179 in the memory-level dielectric layer 170. For example, a first photoresist layer (not shown) may be applied over the memory-level dielectric layer 170 and may be lithographically patterned to form an array of discrete openings in the first photoresist layer in the peripheral region 200. A first anisotropic etch process may be performed to form via cavities in the memory-level dielectric layer 170. After removal of the first photoresist layer, a second photoresist layer (not shown) may be applied over the memory-level dielectric layer 170 and may be lithographically patterned to form line-shaped openings in the second photoresist layer within the peripheral region 200. A second anisotropic etch process may be performed to form line cavities in the memory-level dielectric layer 170. The second photoresist layer may be subsequently removed. In one embodiment, the interconnect cavities 179 may be formed as integrated line and via cavities. In this embodiment, each integrated line and via cavity may include a line cavity that is located within an upper portion of the memory-level dielectric layer 170, and at least one via cavity adjoined to a bottom portion of the line cavity and vertically extends through a lower portion of the memory-level dielectric layer 170 and through the dielectric cap layer 108.

A top surface of an underlying metal interconnect structure, such as a fourth metal line structure 648 embedded in an upper portion of the fourth line-and-via-level dielectric material layer 640, may be physically exposed at the bottom of at least a subset of the interconnect cavities 179 in the memory-level dielectric layer 170. Generally, at least a subset of the interconnect cavities 179 vertically extends between the top surface of the memory-level dielectric layer 170 and the top surfaces of an underlying metal line structure through the memory-level dielectric layer 170.

Figure 11:
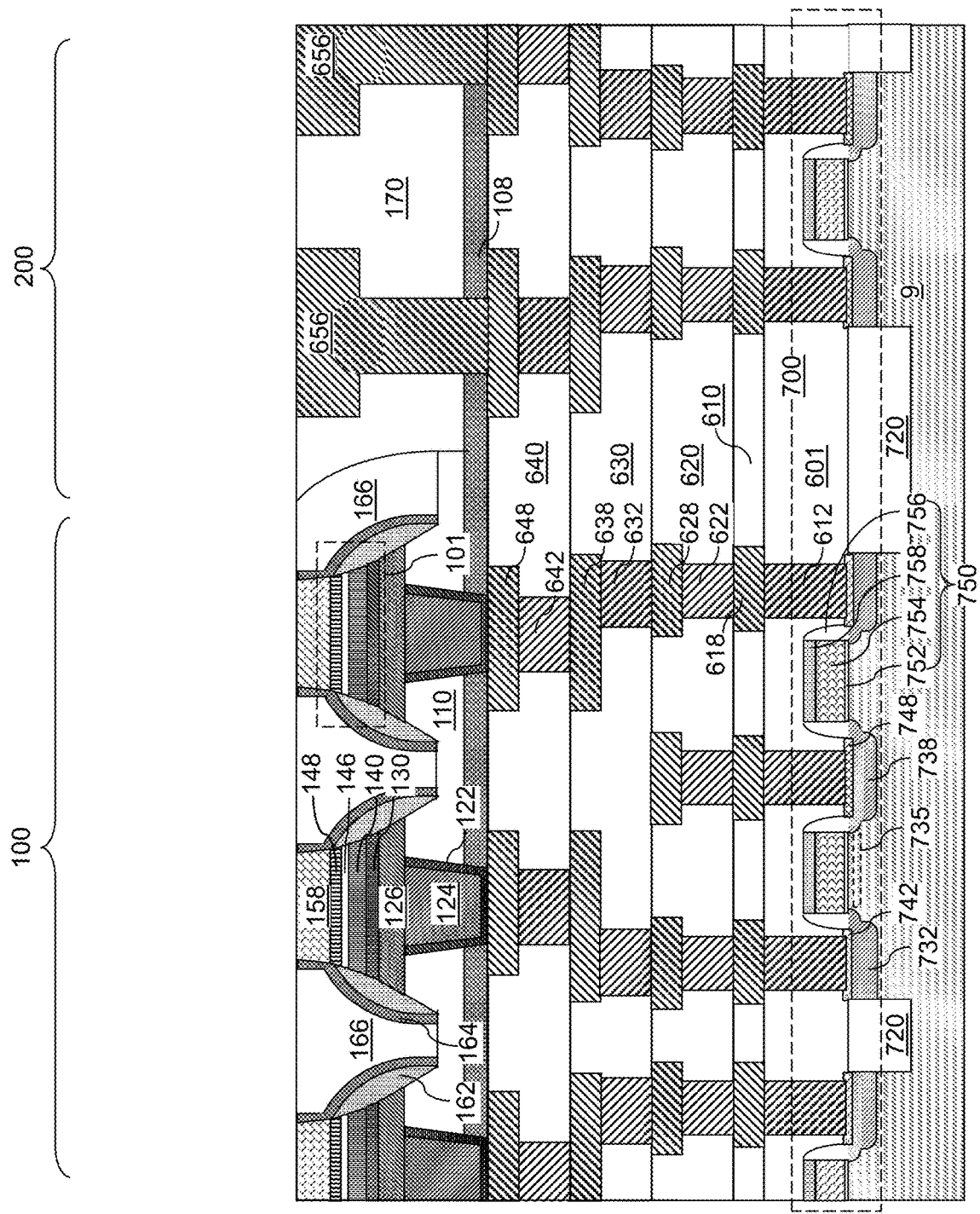
FIG. 11 is a vertical cross-sectional view of the exemplary structure after formation of memory-level metal interconnect structures and planarization of the top electrodes according to an embodiment of the present disclosure.

FIG. 11 is a vertical cross-sectional view of the exemplary structure after formation of memory-level metal interconnect structures and planarization of the top electrodes according to an embodiment of the present disclosure. Referring to FIG. 11, at least one metallic material may be deposited in the interconnect cavities 179. The at least one metallic material is herein referred to as at least one memory-level metallic material. In one embodiment, a metallic barrier material layer (such as a TiN layer, TaN layer, and/or a WN layer) and a metallic fill material (such as W, Cu, Co, Ru, Mo, or an intermetallic alloy) may be deposited in the interconnect cavities 179 and over the memory-level dielectric layer 170.

A planarization process such as a chemical mechanical planarization process may be performed to remove the at least one memory-level metallic material from above the memory-level dielectric layer 170. The chemical mechanical planarization process may remove material portions from above the horizontal plane including the top surfaces of the top electrodes 158. Further, convex portions of the top electrodes 158 may be polished by continuing the chemical mechanical planarization process so that remaining portions of the top electrodes 158 have horizontal top surfaces. Thus, portions of the at least one memory-level metallic material, the memory-level dielectric layer 170, the dielectric encapsulation structure 166, and the dielectric spacers (162, 164) that protrude above the horizontal plane including the planarized top surfaces of the planarized top electrodes 158 may be removed by the chemical mechanical planarization process.

Remaining portions of the at least one memory-level metallic material filling the interconnect cavities 179 comprise memory-level metal interconnect structures 656. In one embodiment, the memory-level metal interconnect structures 656 may include integrated line and via structures that includes a respective metal line and a respective set of at least one metal via structures. The metal lines of the memory-level metal interconnect structures 656 may have top surfaces within the horizontal plane including the planarized top surface of the memory-level dielectric layer 170. The metal via structures of the memory-level metal interconnect structures 656 may have bottom surfaces contacting a top surface of a respective underlying metal line structure (such as a respective one of the fourth metal line structures 648). In one embodiment, the bottom surfaces of the memory-level metal interconnect structures 656 may be located within a horizontal plane including bottom surfaces of the array of connection via structures (122, 124).

Generally, the top electrodes 158 of the array of memory cells 101 may be planarized by removing portions of the top electrodes 158 from above the horizontal plane including a planarized top surface of the memory-level dielectric layer 170. The thickness of the top electrodes 158 after the planarization process may be in a range from 4 nm to 60 nm, such as from 8 nm to 30 nm, although lesser and greater thicknesses may also be used. The top surfaces of the top electrodes 158 may be located within the horizontal plane including the top surface of the memory-level dielectric layer 170.

The top surface of the dielectric encapsulation structure 166 may be within a same horizontal plane as the top surface of the memory-level dielectric layer 170. Portions of the array of dielectric spacers (162, 164) located above the horizontal plane including the planarized top surface of the memory-level dielectric layer 170 are removed during planarization of the top electrodes 158 of the array of memory cells 101. In this embodiment, the dielectric spacers (162, 164) may have top surfaces that are located within the horizontal plane including the top surface of the memory-level dielectric layer 170. For example, top surfaces of the outer dielectric spacer portions 164 may be within the same horizontal plane as the top surface of the memory-level dielectric layer 170.

Figure 12:
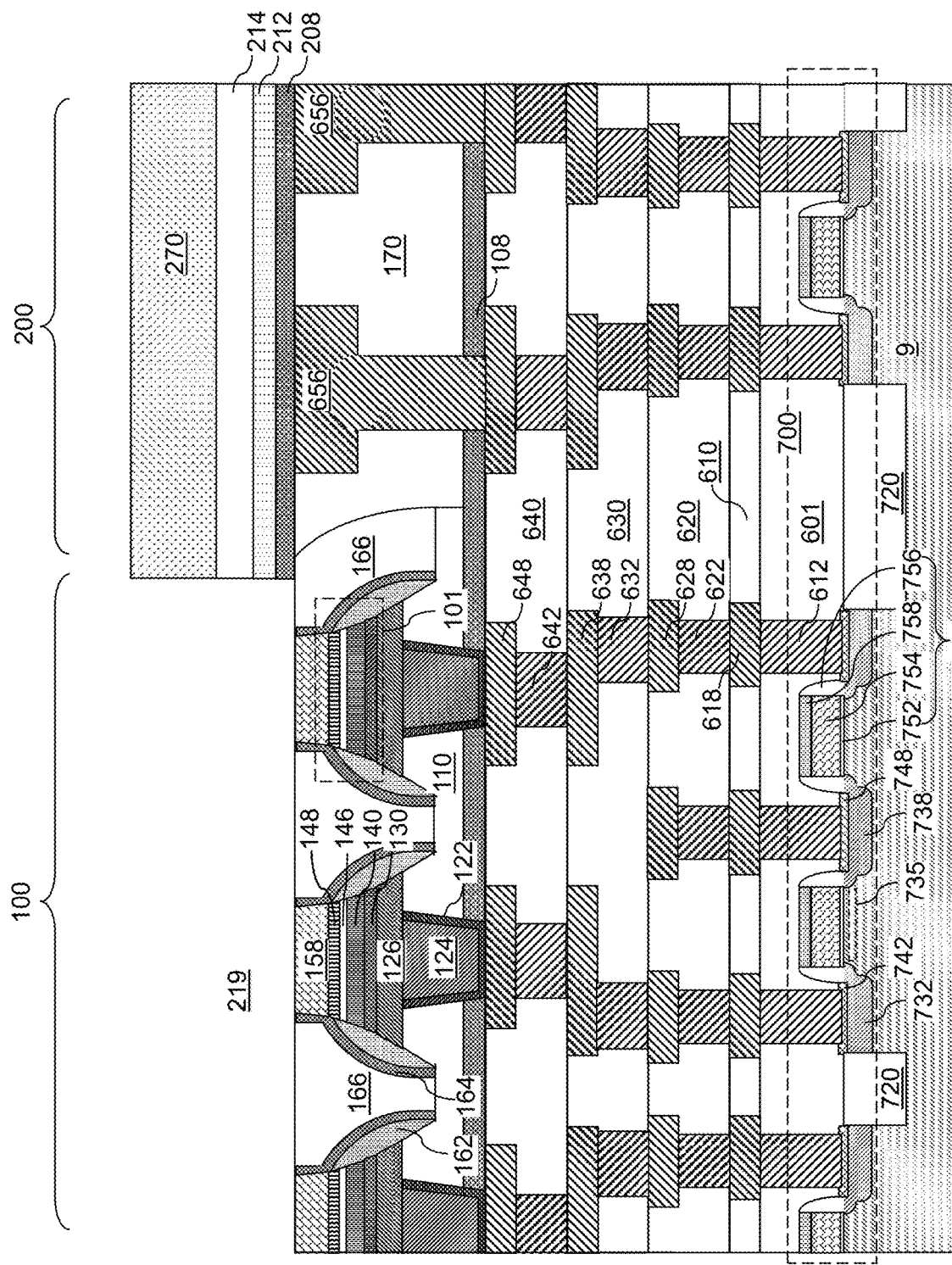
FIG. 12 is a vertical cross-sectional view of the exemplary structure after deposition and patterning of an upper-level etch stop dielectric layer and at least one dielectric matrix layer according to an embodiment of the present disclosure.

FIG. 12 is a vertical cross-sectional view of the exemplary structure after deposition and patterning of an upper-level etch stop dielectric layer and at least one dielectric matrix layer according to an embodiment of the present disclosure. Referring to FIG. 12, a layer stack of an upper-level etch stop dielectric layer 208 and at least one dielectric matrix layer (212, 214) may be deposited over the memory-level dielectric layer 170. The upper-level etch stop dielectric layer 208 includes an etch stop material such as silicon nitride, silicon carbide, silicon nitride carbide, or a dielectric metal oxide (such as aluminum oxide, titanium oxide, tantalum oxide, etc.). The upper-level etch stop dielectric layer 208 may contact the a top surface of the memory-level dielectric layer 170. The thickness of the upper-level etch stop dielectric layer 208 may be in a range from 4 nm to 20 nm, such as from 6 nm to 10 nm, although lesser and greater thicknesses may also be used.

The at least one dielectric matrix layer (212, 214) includes an interlayer dielectric (ILD) material that may embed metallic structures. In one embodiment, the at least one dielectric matrix layer (212, 214) may include a first dielectric matrix layer 212 and a second dielectric matrix layer 214. Each of the first dielectric matrix layer 212 and the second dielectric matrix layer 214 may include, for example, undoped silicate glass, a doped silicate glass, organosilicate glass, silicon oxynitride, or silicon carbide nitride. Other dielectric materials are within the contemplated scope of disclosure. The total thickness of the at least one dielectric matrix layer (212, 214) may be in a range from 15 nm to 60 nm, such as from 20 nm to 40 nm, although lesser and greater thicknesses may also be used.

A photoresist layer 270 may be applied over the at least one dielectric matrix layer (212, 214), and may be lithographically patterned to form an array of elongated openings. The elongated openings may be rectangular opening that laterally extend along the horizontal direction of rows of memory cells 101. Each elongated opening in the photoresist layer 270 may overlie a respective row of memory cells 101. An anisotropic etch process may be performed to transfer the pattern of the elongated openings in the photoresist layer 270 through the at least one dielectric matrix layer (212, 214) and through the upper-level etch stop dielectric layer 208. The anisotropic etch process may include a first etch step that etches the material(s) of the at least one dielectric matrix layer (212, 214) selective to the material of the upper-level etch stop dielectric layer 208, and a second etch step that etches the material of the upper-level etch stop dielectric layer 208 selective to the materials of the outer dielectric spacer portions 164 and the dielectric encapsulation structures 166. Line cavities 219 may be formed underneath the elongated openings in the photoresist layer 270. Top surfaces of a row of top electrodes 158 may be physically exposed at the bottom of each line cavity 219. The photoresist layer 270 may be subsequently removed, for example, by ashing.

Figure 13:
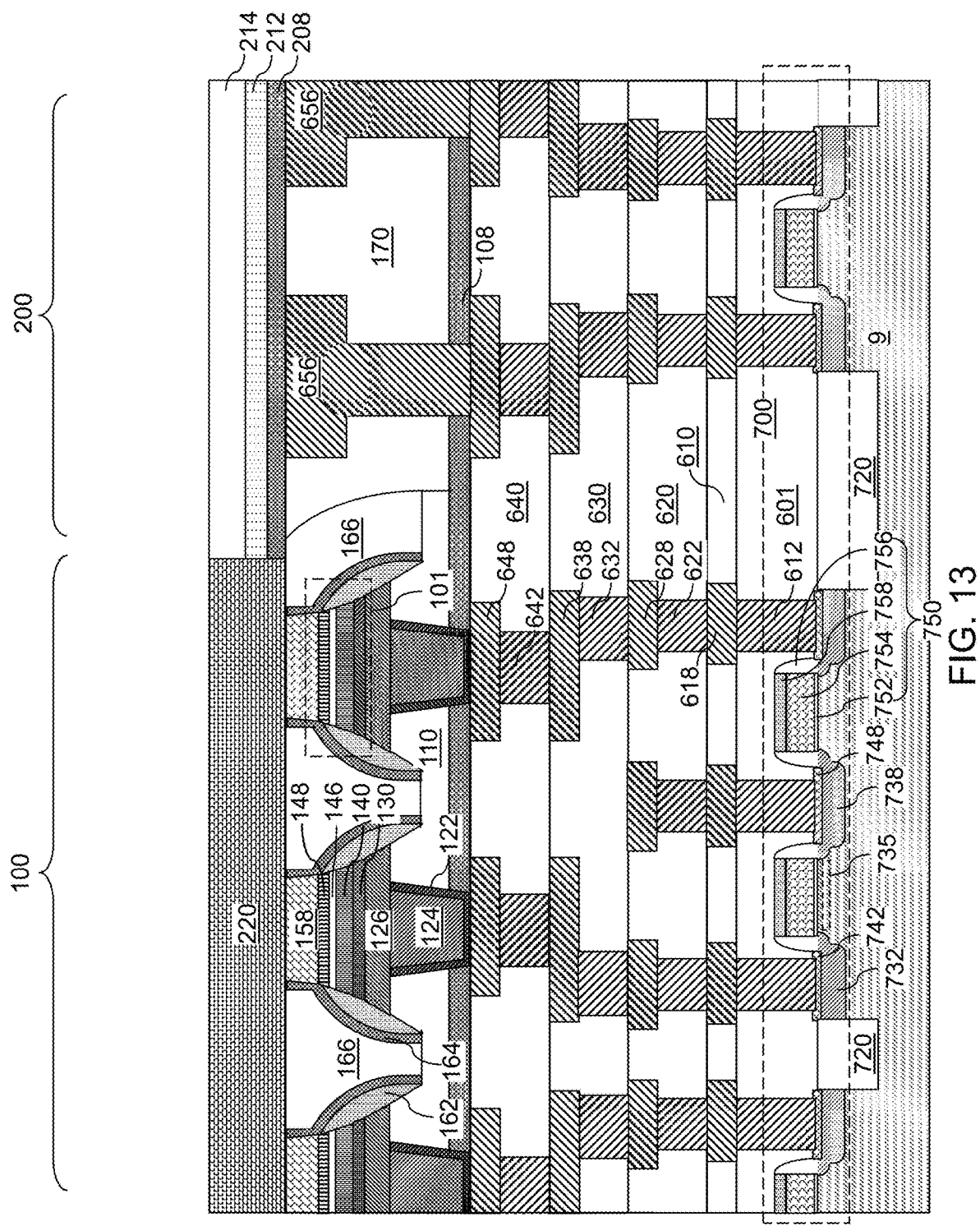
FIG. 13 is a vertical cross-sectional view of the exemplary structure after formation of top-interconnection metal lines according to an embodiment of the present disclosure.

FIG. 13 is a vertical cross-sectional view of the exemplary structure after formation of top-interconnection metal lines according to an embodiment of the present disclosure. Referring to FIG. 13, at least one metallic material is deposited in the line cavities 219 and over the at least one dielectric matrix layer (212, 214). The at least one metallic material may include a metallic barrier material (such as TiN, TaN, and/or WN) or a metallic fill material (such as Cu, Co, Ru, Mo, W, or an intermetallic alloy). Other suitable metallic materials are within the contemplated scope of disclosure. In one embodiment, the at least one metallic material may consist essentially of TiN, TaN, or WN. Excess portions of the at least one metallic material may be removed from above the horizontal plane including the top surface of the at least one dielectric matrix layer (212, 214). Each remaining portion of the at least one connection-level metallic material that fills a respective one of the line cavities 219 constitutes a top-interconnection metal line 220, which is a metal line that provides electrical interconnection between the top electrodes 158 within a respective row of top electrodes 158. The height of the top-interconnection metal lines 220 may be in a range from 20 nm to 80 nm, such as from 30 nm to 60 nm, although lesser and greater heights may also be used.

Generally, top-interconnection metal lines 220 may be formed on a respective row of top electrodes 158 within the memory cells 101 by depositing and patterning a conductive material above the memory-level dielectric layer 170. The top-interconnection metal lines 220 laterally extend along a horizontal direction, and contact a respective row of top electrodes 158 within the memory cells 101 within a horizontal plane including a top surface of the memory-level dielectric layer 170. Each of the top-interconnection metal lines 220 is embedded in the stack of the upper-level etch stop dielectric layer 208 and the at least one dielectric matrix layer (212, 214). In one embodiment, top surfaces of the dielectric spacers (162, 164) are located within a horizontal plane including the top surface of the memory-level dielectric layer 170 and the bottom surface of the upper-level etch stop dielectric layer 208.

Figure 14:
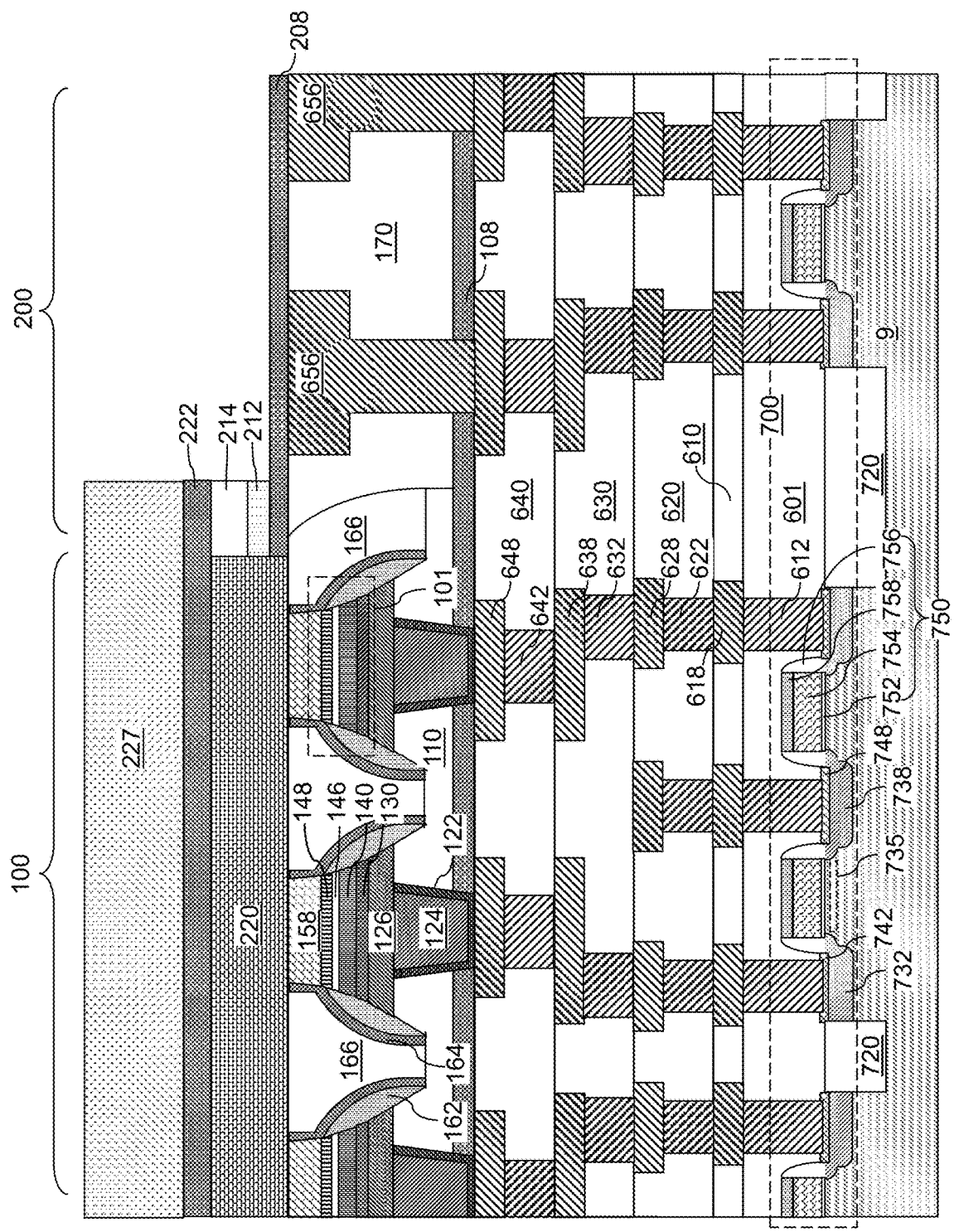
FIG. 14 is a vertical cross-sectional view of the exemplary structure after deposition and patterning of a cap-level etch stop dielectric layer according to an embodiment of the present disclosure.

FIG. 14 is a vertical cross-sectional view of the exemplary structure after deposition and patterning of a cap-level etch stop dielectric layer according to an embodiment of the present disclosure. Referring to FIG. 14, a cap-level etch stop dielectric layer 222 may be applied over the dielectric matrix layer (212, 214) and the top-interconnection metal lines 220. The cap-level etch stop dielectric layer 222 includes an etch stop material such as silicon nitride, silicon carbide, silicon nitride carbide, or a dielectric metal oxide (such as aluminum oxide, titanium oxide, tantalum oxide, etc.). The cap-level etch stop dielectric layer 222 may contact the top surface of the at least one dielectric matrix layer (212, 214). The thickness of the cap-level etch stop dielectric layer 222 may be in a range from 4 nm to 40 nm, such as from 8 nm to 20 nm, although lesser and greater thicknesses may also be used.

A photoresist layer 227 may be applied over the cap-level etch stop dielectric layer 222, and may be lithographically patterned to remove a portion located within the peripheral region. Thus, the photoresist layer 227 covers a portion of the cap-level etch stop dielectric layer 222 in the memory array region 100, and does not cover the portion of the cap-level etch stop dielectric layer 222 located in the peripheral region 200. An etch process may be performed to remove unmasked portions of the cap-level etch stop dielectric layer 222 and the at least one dielectric matrix layer (212, 214) from the peripheral region 200. The etch process may use an anisotropic etch process (such as a reactive ion etch process) and/or an isotropic etch process (such as a wet etch process or a chemical dry etch process). In one embodiment, the at least one dielectric matrix layer (212, 214) and the cap-level etch stop dielectric layer 222 may be located in the memory array region 100 including the array of memory cells 101, and may not be present in the peripheral region 200 located adjacent to the memory array region 100. The photoresist layer 227 may be subsequently removed, for example, by ashing.

Figure 15:
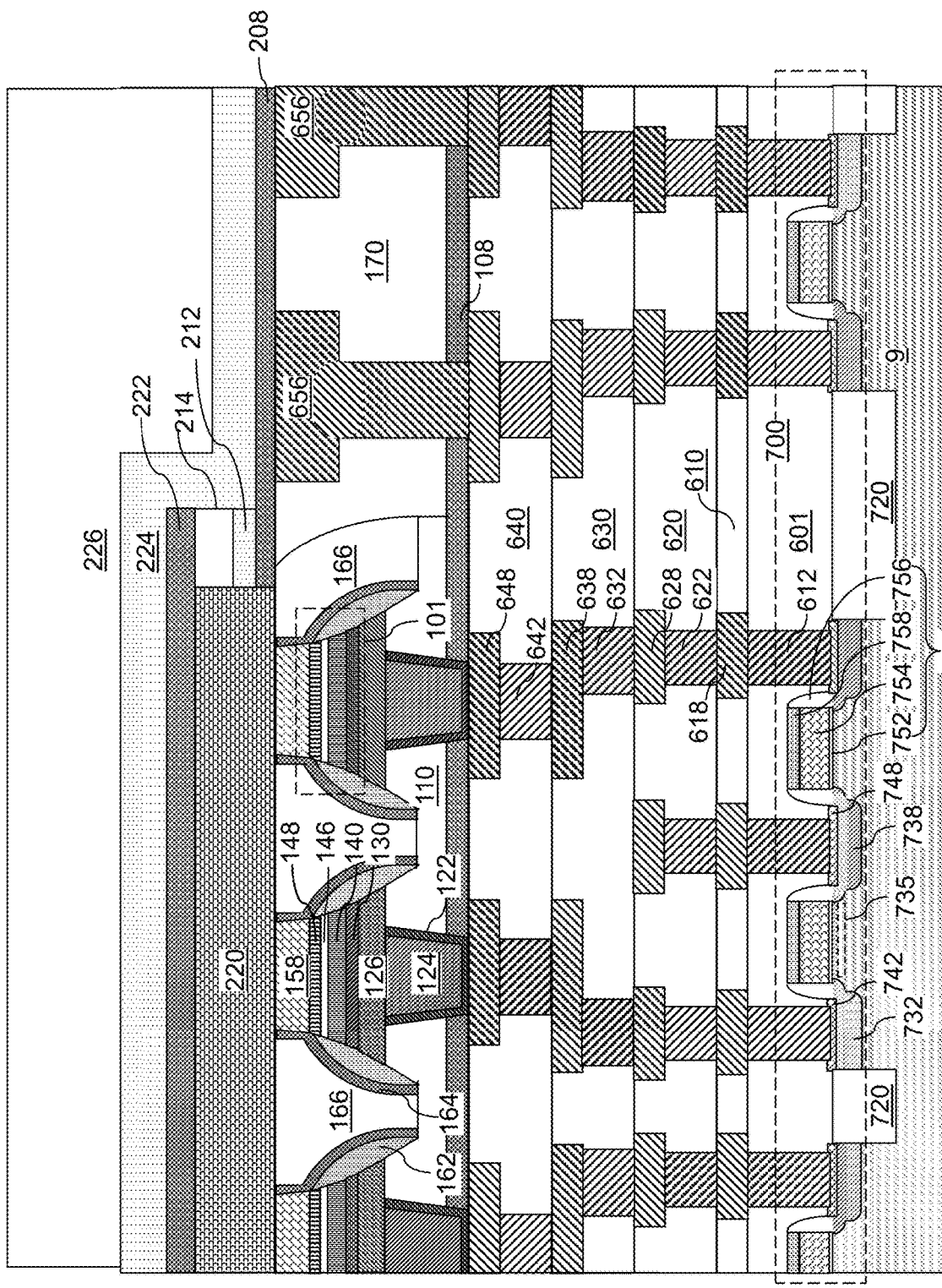
FIG. 15 is a vertical cross-sectional view of the exemplary structure after deposition and planarization of at least one upper-level dielectric layer according to an embodiment of the present disclosure.

FIG. 15 is a vertical cross-sectional view of the exemplary structure after deposition and planarization of at least one upper-level dielectric layer according to an embodiment of the present disclosure. Referring to FIG. 15, at least one upper-level dielectric layer (224, 226) may be subsequently formed over the cap-level etch stop dielectric layer 222 and the upper-level etch stop dielectric layer 208. The at least one upper-level dielectric layer (224, 226) may include, for example, a first upper-level dielectric layer 224 and a second upper-level dielectric layer 226. The first upper-level dielectric layer 224 includes a first dielectric material, and the second upper-level dielectric layer 224 includes a second dielectric material. Each of the first dielectric material and the second dielectric material may include undoped silicate glass, a doped silicate glass, spin-on-glass, porous or non-porous organosilicate glass, silicon nitride, silicon oxynitride, silicon carbide, silicon carbide nitride, or combinations thereof. The dielectric material of the second upper-level dielectric layer 226 may be self-planarizing, or may be planarized by a planarization process such as a chemical mechanical planarization process. In an illustrative example, the first upper-level dielectric layer 224 may include silicon nitride, and the second upper-level dielectric layer 226 may include silicon oxide. The thickness of the at least one upper-level dielectric layer (224, 226) above the cap-level etch stop dielectric layer 222 may be in a range from 40 nm to 500 nm, such as from 80 nm to 300 nm, although lesser and greater thicknesses may also be used.

Figure 16:
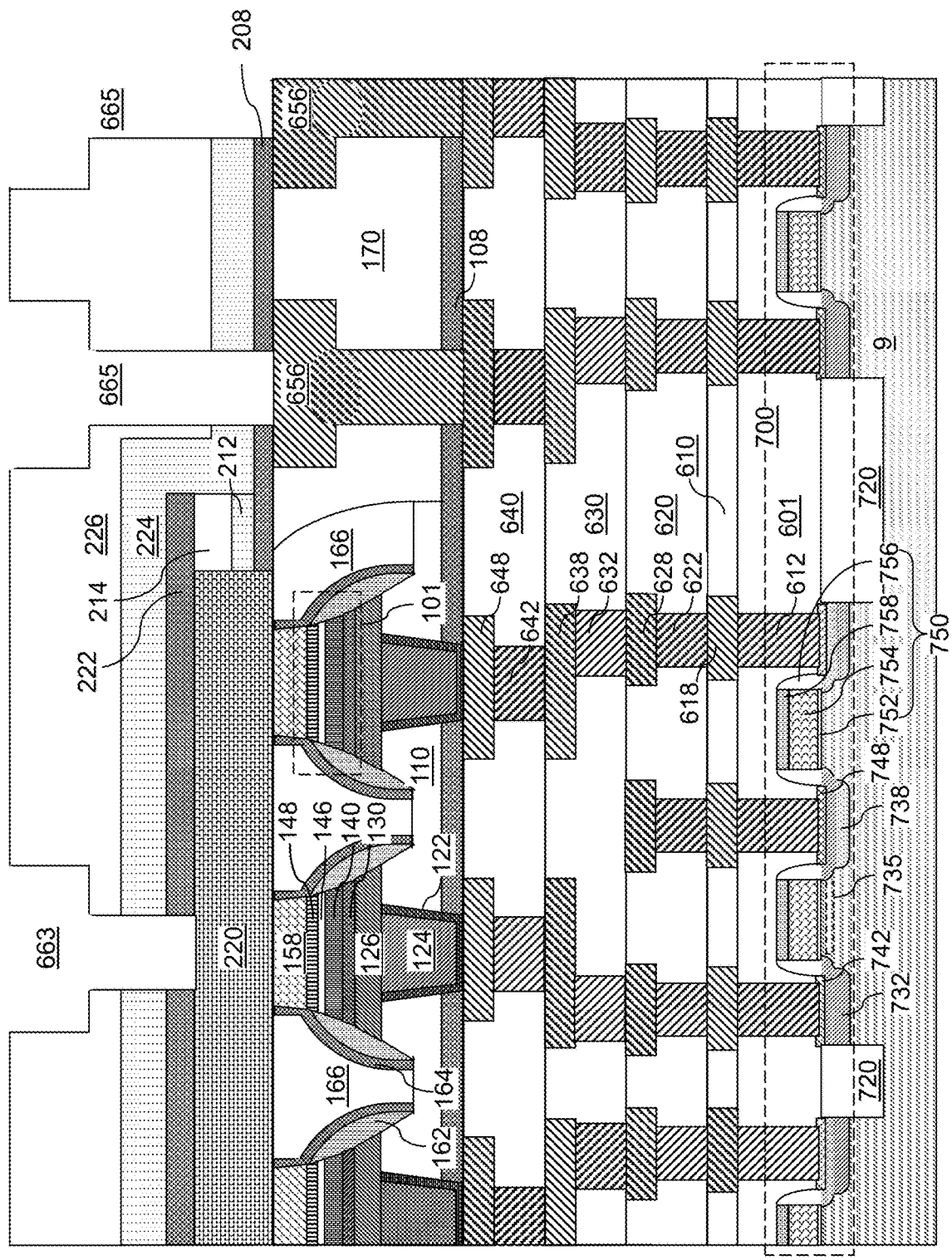
FIG. 16 is a vertical cross-sectional view of the exemplary structure after formation of integrated line and via cavities through the at least one upper-level dielectric layer, the cap-level etch stop dielectric layer, and the upper-level etch stop dielectric layer according to an embodiment of the present disclosure.

FIG. 16 is a vertical cross-sectional view of the exemplary structure after formation of integrated line and via cavities through the at least one upper-level dielectric layer, the cap-level etch stop dielectric layer, and the upper-level etch stop dielectric layer according to an embodiment of the present disclosure. Referring to FIG. 16, at least one lithographic patterning step and at least one anisotropic etch process may be used for form upper-level interconnect cavities (663,665) in the at least one upper-level dielectric layer (224, 226). For example, a first photoresist layer (not shown) may be applied over the at least one upper-level dielectric layer (224, 226) and may be lithographically patterned to form an array of discrete openings in the first photoresist layer. A first anisotropic etch process may be performed to form via cavities in the at least one upper-level dielectric layer (224, 226). After removal of the first photoresist layer, a second photoresist layer (not shown) may be applied over the at least one upper-level dielectric layer (224, 226)and may be lithographically patterned to form line-shaped openings in the second photoresist layer. A second anisotropic etch process may be performed to form line cavities in the at least one upper-level dielectric layer (224, 226). The second photoresist layer may be subsequently removed.

First upper-level interconnect cavities 663 may be formed in the memory array region 100, and second upper-level interconnect cavities 665 may be formed in the peripheral region 200. In on embodiment, the upper-level interconnect cavities (663, 665) may be formed as integrated line and via cavities. In this embodiment, each integrated line and via cavity may include a line cavity that is located within an upper portion of the at least one upper-level dielectric layer (224, 226), and at least one via cavity adjoined to a bottom portion of the line cavity and vertically extends through an upper portion of the at least one upper-level dielectric layer (224, 226) and through the upper-level etch stop dielectric layer 208 or through the cap-level etch stop dielectric layer 222. Specifically, line and via cavities formed in the memory array region 100 vertically extend through the cap-level etch stop dielectric layer 222, and line and via cavities formed in the peripheral region 200 vertically extend through the upper-level etch stop dielectric layer 208. A top surface of a top-interconnection metal line 220 may be physically exposed underneath each line and via cavity (which is a first upper-level interconnect cavity 663) in the memory array region 100, and a top surface of a memory-level metal interconnect structures 656 may be physically exposed underneath each line and via cavity (which is a second upper-level interconnect cavity 665) in the peripheral region 200. Generally, the first upper-level interconnect cavities 663 may vertically extend between the top surface of the at least one upper-level dielectric layer (224, 226) and a top surface of a respective one of the top-interconnection metal lines 220, and the second upper-level interconnect cavities 665 may vertically extend between the top surface of the at least one upper-level dielectric layer (224, 226) and a top surface of a respective one of the memory-level metal interconnect structures 656.

Figure 17A:
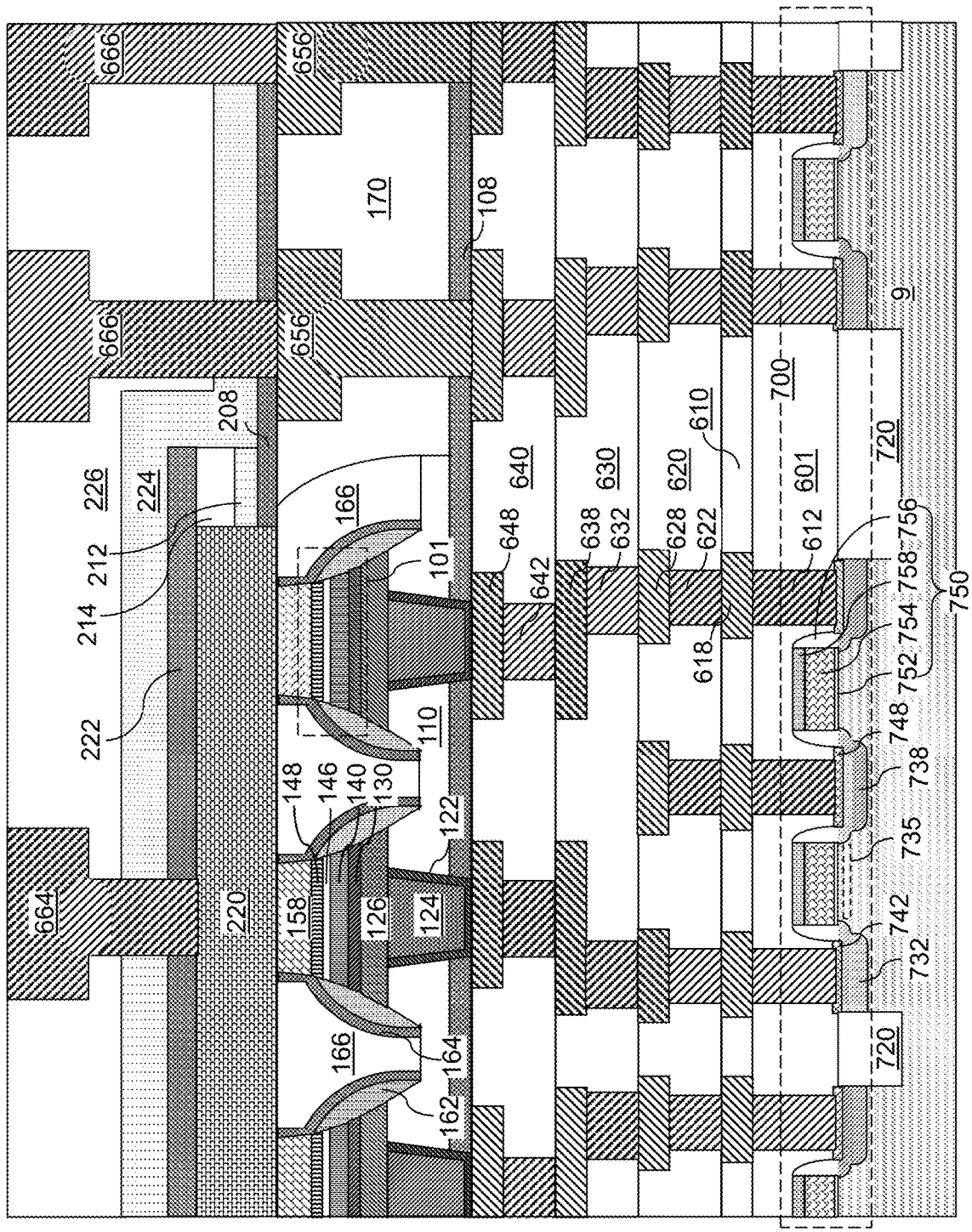
FIG. 17A is a vertical cross-sectional view of the exemplary structure after formation of upper metal interconnect structures according to an embodiment of the present disclosure.
Figure 17B:
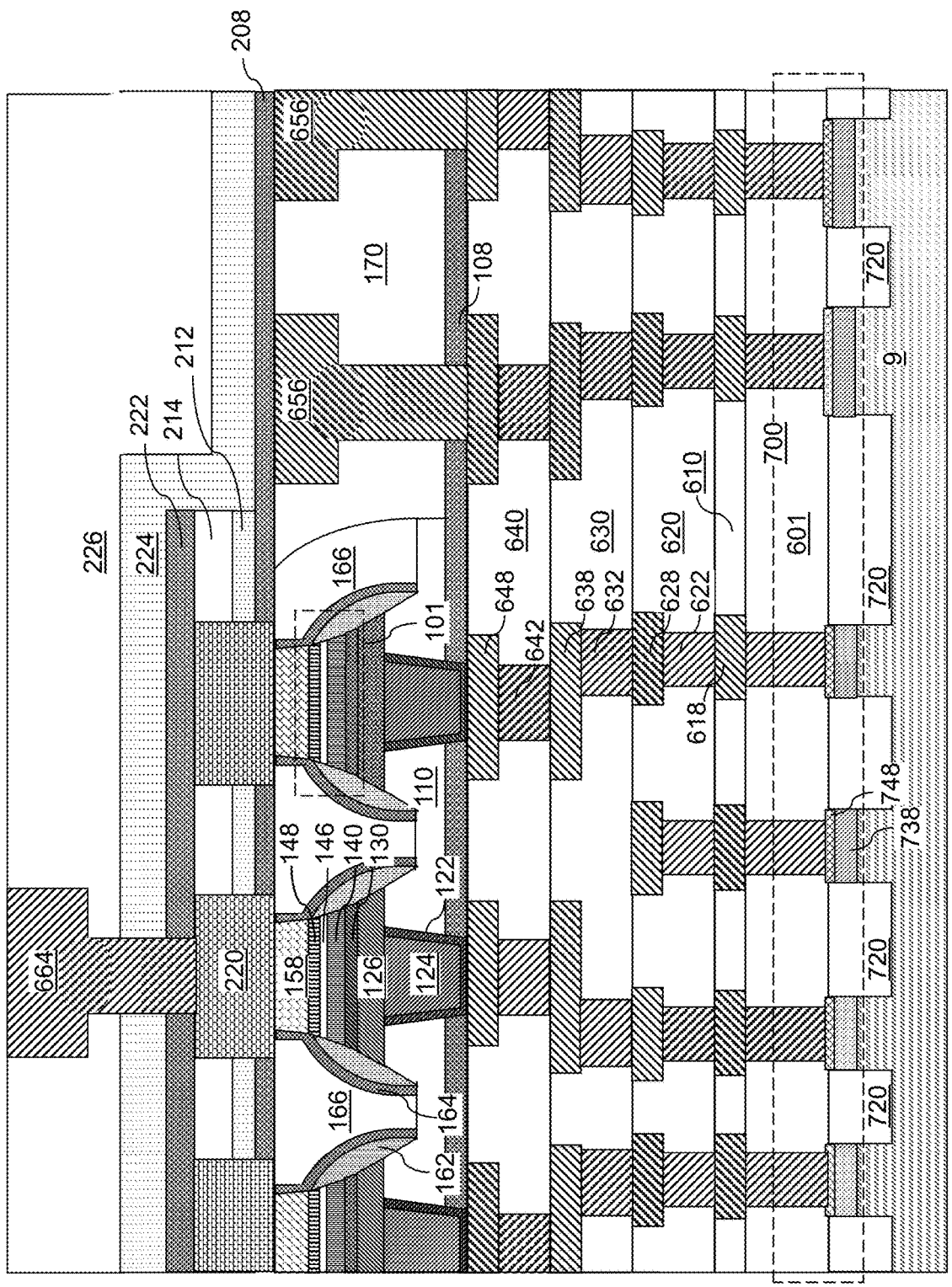
FIG. 17B is another vertical cross-sectional view of the exemplary structure of FIG. 17A along a vertical direction that is perpendicular to the plane of the vertical cross-sectional view of FIG. 17A.

FIG. 17A is a vertical cross-sectional view of the exemplary structure after formation of upper metal interconnect structures according to an embodiment of the present disclosure. FIG. 17B is another vertical cross-sectional view of the exemplary structure of FIG. 17A along a vertical direction that is perpendicular to the plane of the vertical cross-sectional view of FIG. 17A. Referring to FIGS. 17A and 17B, at least one metallic material may be deposited in the upper-level interconnect cavities (663, 665). The at least one metallic material is herein referred to as at least one upper-level metallic material. In one embodiment, a metallic barrier material layer (such as a TiN layer, TaN layer, and/or a WN layer) and a metallic fill material (such as W, Cu, Co, Ru, Mo, or an intermetallic alloy) may be deposited in the upper-level interconnect cavities (663, 665) and over the at least one upper-level dielectric layer (224, 226).

A planarization process such as a chemical mechanical planarization process may be performed to remove the at least one upper-level metallic material from above the at least one upper-level dielectric layer (224, 226). The chemical mechanical planarization process may remove the at least one upper-level metallic material from above the horizontal plane including the top surface of the at least one upper-level dielectric layer (224, 226). Remaining portions of the at least one upper-level metallic material filling the upper-level interconnect cavities (663, 665) comprise upper-level metal interconnect structures (664, 666). In one embodiment, the upper-level metal interconnect structures (664, 666) may include integrated line and via structures that includes a respective metal line and a respective set of at least one metal via structures. The metal lines of the upper-level metal interconnect structures (664, 666) may have top surfaces within the horizontal plane including the top surface of the at least one upper-level dielectric layer (224, 226).

The upper-level metal interconnect structures (664, 666) comprise first upper-level metal interconnect structures 664 and second upper-level metal interconnect structures 666. The first upper-level metal interconnect structures 664 may vertically extend through the at least one upper-level dielectric layer (224, 226), and may include a respective via portion that contacts a respective one of the top-interconnection metal lines 220. The second upper-level metal interconnect structures 666 may vertically extend through the at least one upper-level dielectric layer (224, 226), and may include a respective via portion that contacts a respective one of the memory-level metal interconnect structures 656.

Figure 18:
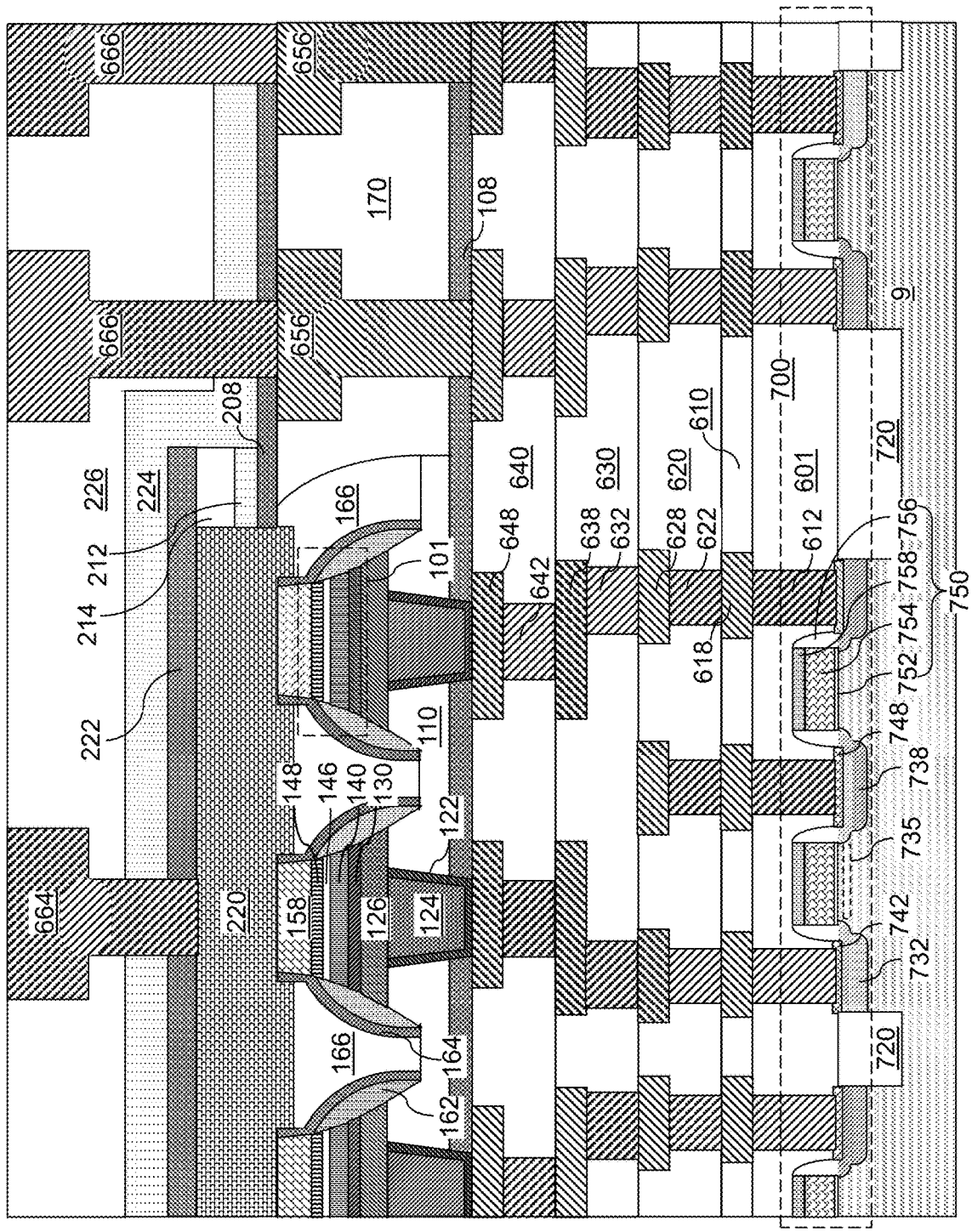
FIG. 18 is a vertical cross-sectional view of a first alternative configuration of the exemplary structure after formation of upper metal interconnect structures according to an embodiment of the present disclosure.

Referring to FIG. 18, a first alternative configuration of the exemplary structure may be derived from the exemplary structure illustrated in FIG. 12 in embodiments in which the etch process that forms the line cavities 219 collaterally etches the dielectric encapsulation structure 166. The collateral recessing of the dielectric encapsulation structure 166 during formation of the line cavities 219 may occur in instances where the anisotropic etch process that etches the material of the upper-level etch stop dielectric layer 208 also etches the material of the dielectric encapsulation structure 166 albeit at a lesser etch rate. In one embodiment, the collateral vertical etch distance of the material of the dielectric encapsulation structure 166 may be less than the thickness of the top electrodes 158. In one embodiment, the etch chemistry of the etch process that etches the line cavities 219 may be selective to the material of the outer dielectric spacer portions 164. The processing steps of FIGS. 13-17B may be subsequently performed to provide the first alternative configuration of the exemplary structure illustrated in FIG. 18. In such an embodiment, each top-connection metal line 220 may have downward-protruding portions that vertically extend below the horizontal plane including the top surface of the top electrodes 158. The raised portions of the bottom surface of each top-connection metal line 220 may contact a respective row of top electrodes 158, which may be located within a horizontal plane including an interface between the memory-level dielectric layer 170 and the upper-level etch stop dielectric layer 208. The vertical protrusion distance by which the downward-protruding portions of each top-connection metal line 220 vertically extends below the horizontal plane including an interface between the memory-level dielectric layer 170 and the upper-level etch stop dielectric layer 208 may be in a range from 0.1 nm to 80 nm, such as from 2 nm to 40 nm, although lesser and greater vertical protrusion distances may also be employed.

Figure 19:
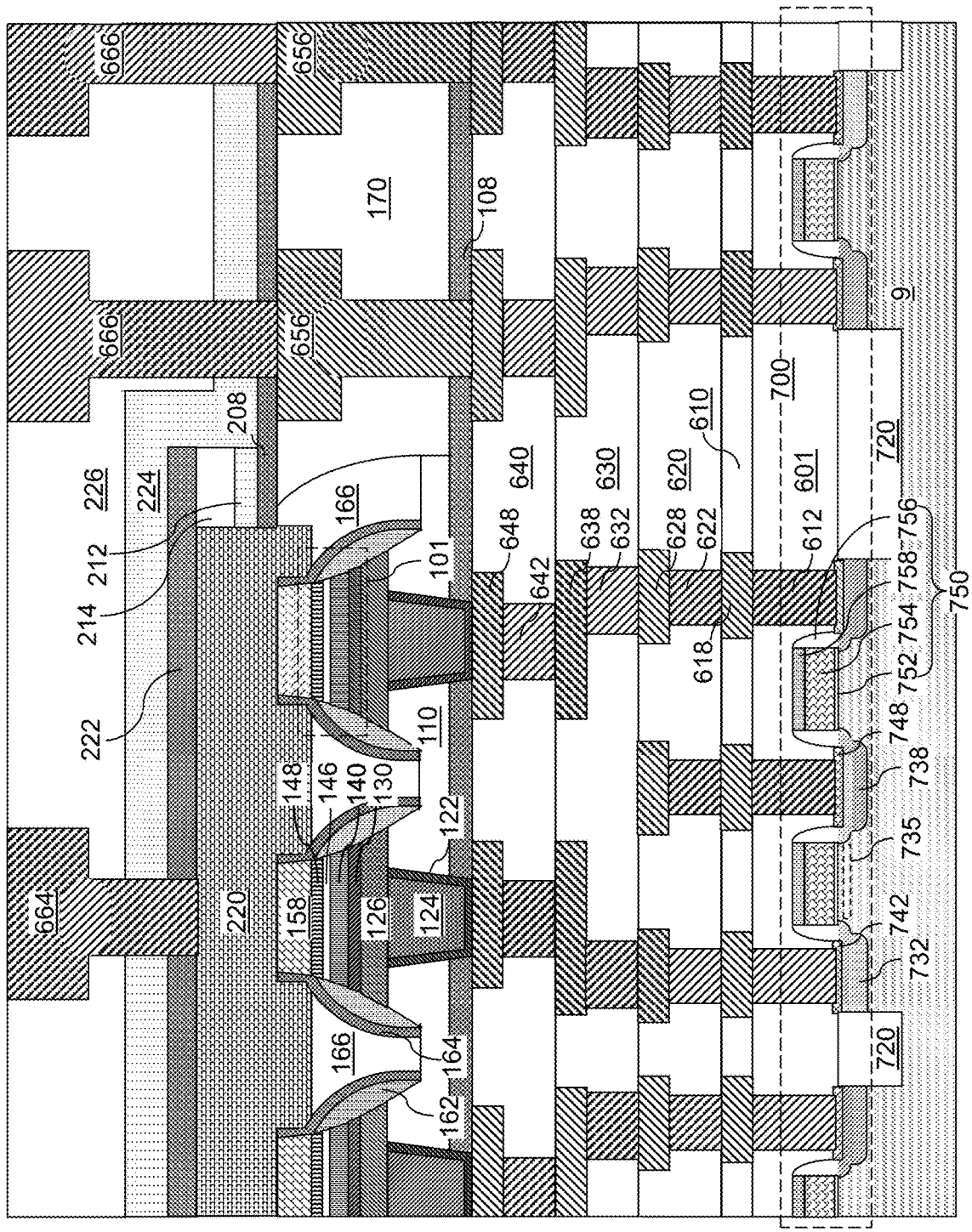
FIG. 19 is a vertical cross-sectional view of a second alternative configuration of the exemplary structure after formation of upper metal interconnect structures according to an embodiment of the present disclosure.

Referring to FIG. 19, a second alternative configuration of the exemplary structure may be derived from the first alternative configuration of the exemplary structure illustrated in FIG. 18, by increasing the collateral recessing of the dielectric encapsulation structure 166 during formation of the line cavities 219 to a distance that is greater than the thickness of the top electrodes 158. The raised portions of the bottom surface of each top-connection metal line 220 can contact a respective row of top electrodes 158, which can be located within a horizontal plane including an interface between the memory-level dielectric layer 170 and the upper-level etch stop dielectric layer 208. The vertical protrusion distance by which the downward-protruding portions of each top-connection metal line 220 vertically extends below the horizontal plane including an interface between the memory-level dielectric layer 170 and the upper-level etch stop dielectric layer 208 may be in a range from 20 nm to 100 nm, such as from 30 nm to 60 nm, although lesser and greater vertical protrusion distances may also be employed.

Figure 20:
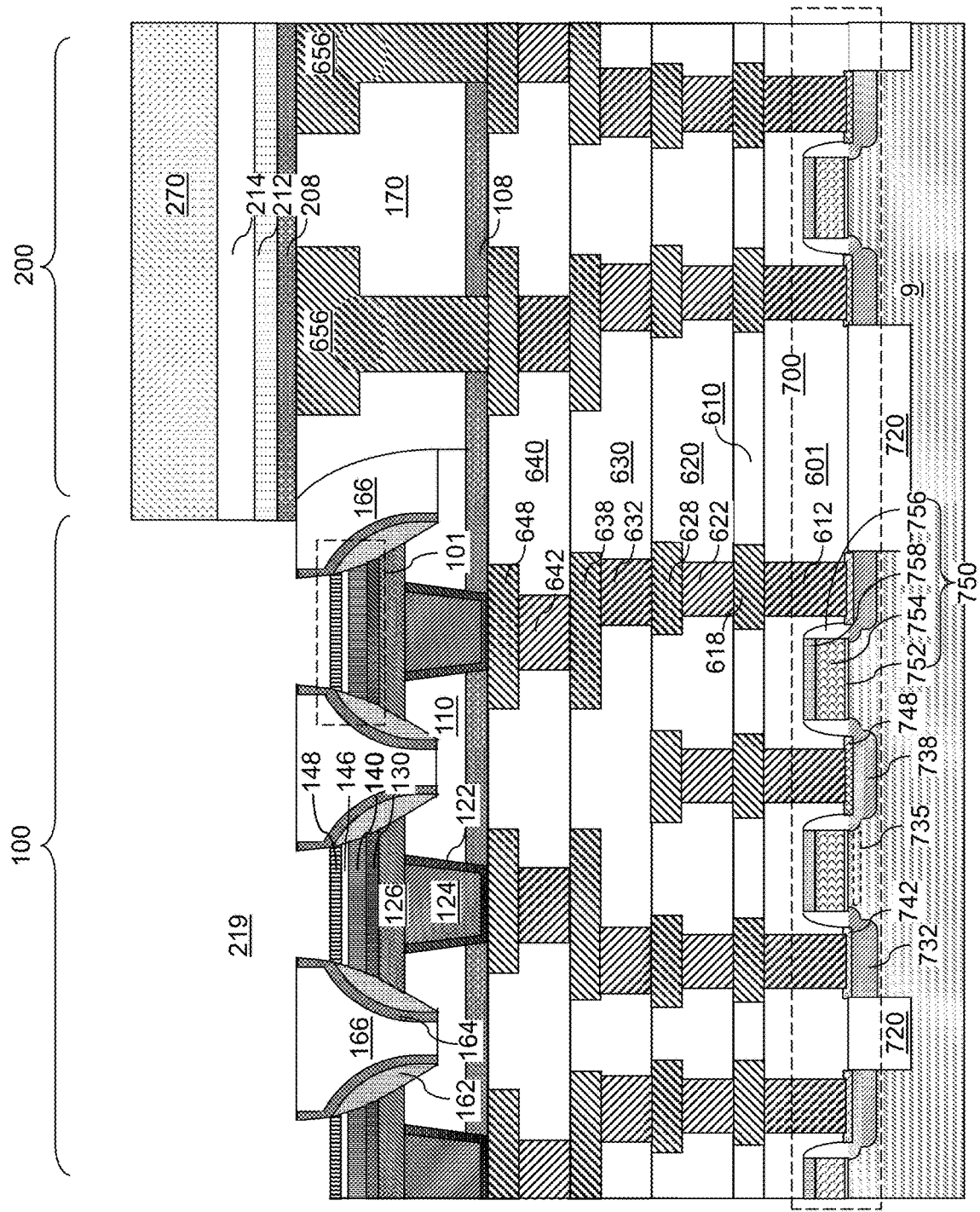
FIG. 20 is a vertical cross-sectional view of a third alternative configuration of the exemplary structure after removal of sacrificial top electrodes according to an embodiment of the present disclosure.

Referring to FIG. 20, a third alternative configuration of the exemplary structure may be derived from the exemplary structure of FIG. 12 by performing an etch process that removes the top electrodes 158 selective to the materials of the dielectric encapsulation structure 166, the dielectric spacers (162, 164), and topmost layers of the memory cells 101 (such as the free magnetization layers 148). For example, a wet etch process that etches the metallic material of the top electrodes 158 selective to the material of the free magnetization layers 148 and selective to dielectric materials can be performed. In this configuration, the top electrodes 158 as formed at the processing steps of FIGS. 4-11 are herein referred to as sacrificial top electrodes.

Figure 21:
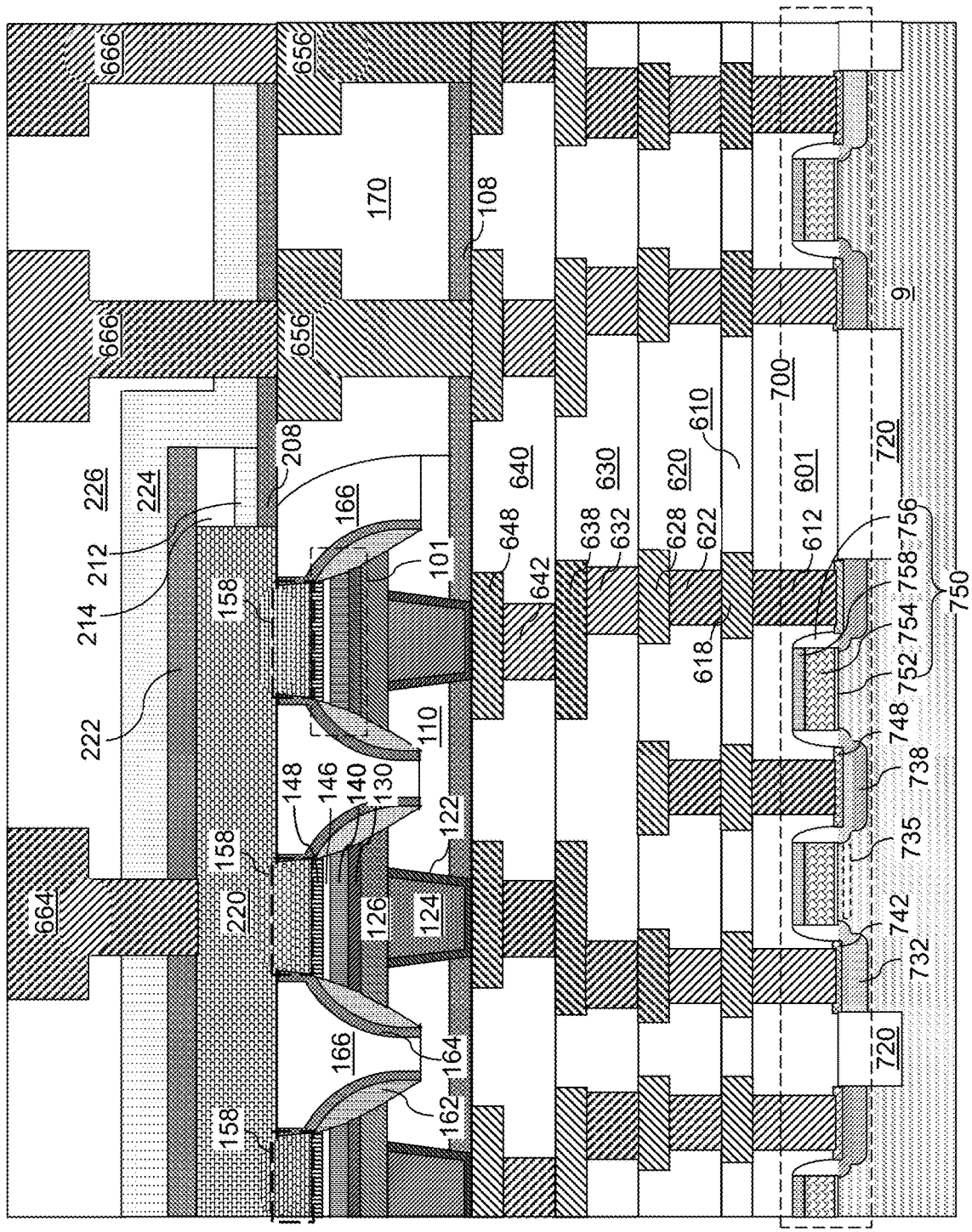
FIG. 21 is a vertical cross-sectional view of the third alternative configuration of the exemplary structure after formation of upper metal interconnect structures according to an embodiment of the present disclosure.

Referring to FIG. 21, the processing steps of FIGS. 13-17B may be subsequently performed. The top-interconnection metal lines 220 incorporate portions that fill the volumes formed by removal of the sacrificial top electrodes. In such an embodiment, each portion of the top-interconnection metal lines 220 that fill a volume of a sacrificial top electrode functions as a top electrode 158. Thus, each top-interconnection metal line 220 incorporates a row of top electrodes 158 therein. In the third configuration of the exemplary structure, each top-interconnection metal line 220 includes a row of top electrodes 158 having a same material composition as an overlying metal line portion of the top-interconnection metal line 220. In one embodiment, the top-interconnection metal line 220 may include a metal having higher electrical conductivity than a metallic material of the sacrificial top electrodes. For example, the top electrodes may include titanium nitride, and the top-interconnection metal lines 220 may include copper or tungsten. In such an embodiment, the top-interconnection metal lines 220 may provide low resistance electrically conductive contact to the top node of the memory cells 101.

Figure 22:
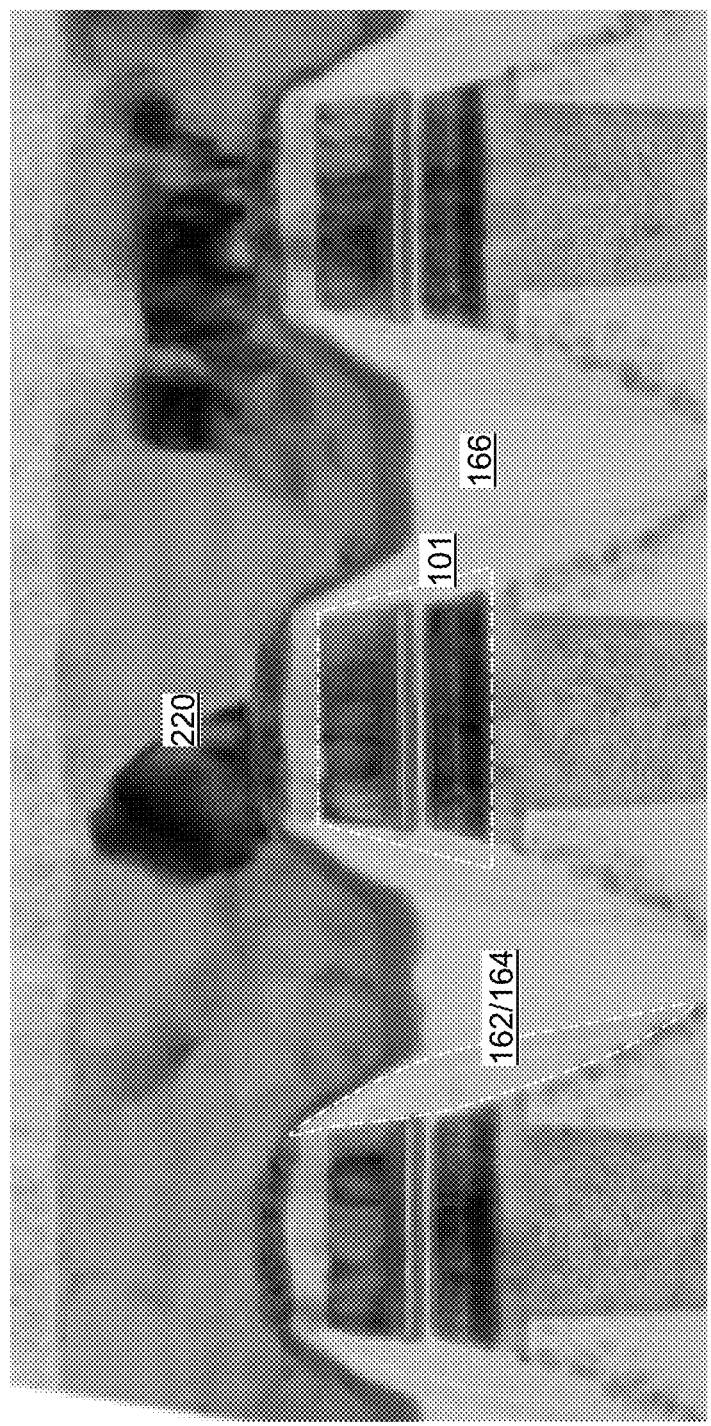
FIG. 22 is a scanning electron micrograph (SEM) of an example of the second alternative configuration of the exemplary structure according to an embodiment of the present disclosure.

FIG. 22 is a scanning electron micrograph (SEM) of an example of the second alternative configuration of the exemplary structure according to an embodiment of the present disclosure. The dielectric spacers (162, 164) are present around the top electrodes 158, and provide electrical isolation between the memory cells 101 and the top-interconnection metal lines 220. Thus, component layers of the memory cells 101 are electrically isolated from the top-interconnection metal lines 220 by the dielectric spacers (162, 164).

Figure 23:
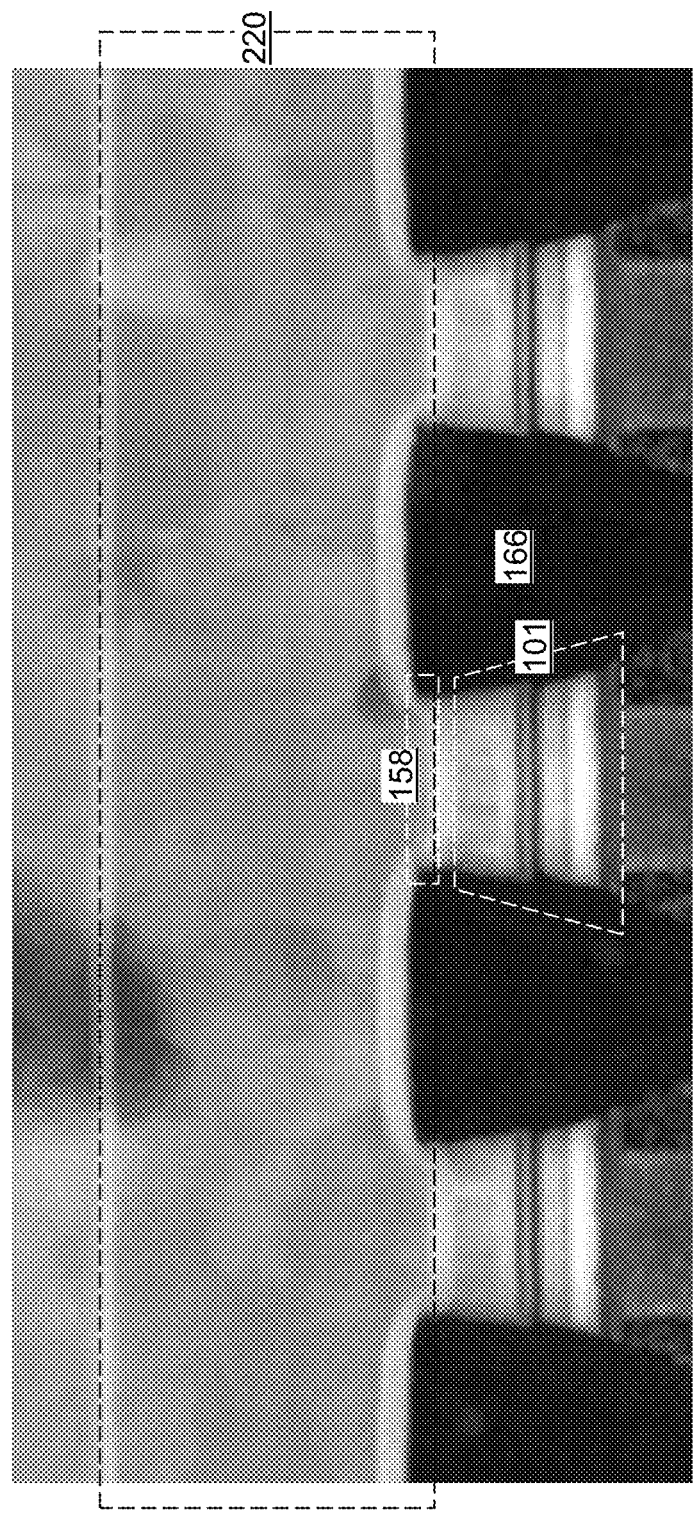
FIG. 23 is a scanning electron micrograph (SEM) of an example of the third alternative configuration of the exemplary structure according to an embodiment of the present disclosure.

FIG. 23 is a scanning electron micrograph (SEM) of an example of the third alternative configuration of the exemplary structure according to an embodiment of the present disclosure. The top electrodes 158 may be formed as integral portions of each top-interconnection metal line 220, and contact a top surface of a respective memory cell 101. This configuration may provide low resistance electrical contact to the top node of the memory cells 101.

Referring collectively to FIGS. 1-23 and according to various embodiments of the present disclosure, a memory array device is provided, which may be, for example, a magnetic tunnel junction memory device. The memory array device comprises an array of memory cells (126, 101, 158) located over a substrate 9, wherein each of the memory cells (126, 101, 158) comprises, from bottom to top, a bottom electrode 126, a memory element 101, and a top electrode 158; a memory-level dielectric layer 170 laterally surrounding the array of memory cells 101, wherein top surfaces of the top electrodes 158 are located within a horizontal plane including a top surface of the memory-level dielectric layer 170; and top-interconnection metal lines 220 laterally extending along a horizontal direction, wherein each of the top-interconnection metal lines 220 contacts, or incorporates, a respective row of top electrodes 158. Each bottom surface of the top electrodes 158 can contact a top surface of a respective memory element 101 within the array of memory elements 101.

In some embodiments, each of the top-interconnection metal lines 220 contacts top surfaces of the respective row of top electrodes 158 within a horizontal plane including a top surface of the memory-level dielectric layer 170. In one embodiment, a dielectric encapsulation structure 166 laterally surrounds the array of memory cells 101; and the top-interconnection metal lines 220 contact the dielectric encapsulation structure 166 within the horizontal plane including the top surface of the memory-level dielectric layer 170 as illustrated in FIGS. 17A and 17B. In one embodiment, a dielectric encapsulation structure 166 laterally surrounds the array of memory cells 101; and the top-interconnection metal lines 220 contact the dielectric encapsulation structure 166 within a horizontal plane that is located below the horizontal plane including the top surface of the memory-level dielectric layer 170 as illustrated in FIGS. 18 and 19.

In one embodiment, each of the top-interconnection metal lines 220 incorporates the respective row of top electrodes 158; a dielectric encapsulation structure 166 laterally surrounds the array of memory cells 101; and the respective row of top electrodes 158 protrudes downward below a horizontal plane including planar bottom surfaces of the top-interconnection metal lines 220 that contact the dielectric encapsulation structure 166 as illustrated in FIG. 21.

In one embodiment, the memory array device comprises memory-level metal interconnect structures 656 embedded within the memory-level dielectric layer 170 and comprising metal lines having top surfaces within the horizontal plane including the top surface of the memory-level dielectric layer 170. In one embodiment, the memory array device comprises an array of connection via structures (122, 124) located underneath the array of memory cells (126, 101, 158) and contacting a bottom surface of a respective one of the bottom electrodes 126.

In one embodiment, the memory array device comprises a lower-level dielectric layer (such as the fourth line-and-via-level dielectric material layer 640) located between the substrate 9 and the memory-level dielectric layer 170; and lower-level metal lines (such as the fourth metal line structures 648) embedded in the lower-level dielectric layer and having top surfaces within a horizontal plane including a top surface of the lower-level dielectric layer, wherein the array of connection via structures (122, 124) and via portions of the memory-level metal interconnect structures 656 contact the lower-level metal lines.

In one embodiment, the memory array device comprises: at least one upper-level dielectric layer (224, 226) located above the memory-level dielectric layer 170; and first upper-level metal interconnect structures 664 vertically extending through the at least one upper-level dielectric layer (224, 226) and comprising a respective via portion that contacts a respective one of the top-interconnection metal lines 220. In one embodiment, the memory array device may comprise second upper-level metal interconnect structures 666 vertically extending through the at least one upper-level dielectric layer (224, 226) and comprising a respective via portion that contacts a respective one of the memory-level metal interconnect structures 656.

In one embodiment, the memory array device comprises: an upper-level etch stop dielectric layer 208 contacting a top surface of the memory-level dielectric layer 170; and at least one dielectric matrix layer (212, 214) overlying the upper-level etch stop dielectric layer 208 and underlying the at least one upper-level dielectric layer (224, 226), wherein each of the top-interconnection metal lines 220 is embedded in the upper-level etch stop dielectric layer 208 and the at least one dielectric matrix layer (212, 214).

In one embodiment, the memory array device may be a magnetic tunnel junction (MTJ) memory array device, and each of the memory elements 101 comprises: a reference magnetization layer 143; a nonmagnetic tunnel barrier layer 146 in contact with the reference magnetization layer 143; and a free magnetization layer 148 in contact with the nonmagnetic tunnel barrier layer 146.

According to an embodiment of the present disclosure, a memory array device is provided, which comprises: an array of memory cells 101 located over a substrate 9, wherein each of the memory cells 101 comprises, from bottom to top, a bottom electrode 126, a memory element 101, and a top electrode 158; an array of dielectric spacers (162, 164), wherein each of the dielectric spacers (162, 164) laterally surrounds a respective one of the memory cells 101; a memory-level dielectric layer 170 laterally surrounding the array of dielectric spacers (162, 164); and top- interconnection metal lines 220 laterally extending along a horizontal direction, wherein each of the top-interconnection metal lines 220 contacts, or incorporates, a respective row of top electrodes 158, wherein top surfaces of the dielectric spacers (162, 164) are located within a horizontal plane including a top surface of the memory-level dielectric layer 170. Each bottom surface of the top electrodes 158 may contact a top surface of a respective memory element 101 within the array of memory elements 101.

In one embodiment, each dielectric spacer (162, 164) within the array of dielectric spacers (162, 164) laterally surrounds, and contacts, a respective one of the top electrodes 158. In one embodiment, each of the top-interconnection metal lines 220 is embedded within a stack of an upper-level etch stop dielectric layer 208 and at least one dielectric matrix layer (212, 214) that overlies the memory-level dielectric layer 170.

In one embodiment, the memory array device comprises: an array of connection via structures (122, 124) located underneath the array of memory cells (126, 101, 158) and contacting a bottom surface of a respective one of the bottom electrodes 126; and memory-level metal interconnect structures 656 embedded within the memory-level dielectric layer 170 and comprising metal lines having top surfaces within the horizontal plane including the top surface of the memory-level dielectric layer 170 and comprising metal via structures having bottom surfaces within a horizontal plane including bottom surfaces of the array of connection via structures (122, 124).

In one embodiment, the memory array device comprises: at least one upper-level dielectric layer (224, 226) located above the at least one dielectric matrix layer (212, 214); first upper-level metal interconnect structures 664 vertically extending through the at least one upper-level dielectric layer (224, 226) and comprising a respective via portion that contacts a respective one of the top-interconnection metal lines 220; and second upper-level metal interconnect structures 666 vertically extending through the at least one upper-level dielectric layer (224, 226) and comprising a respective via portion that contacts a respective one of the memory-level metal interconnect structures 656.

In one embodiment, the at least one dielectric matrix layer (212, 214) is located in a memory array region 100 including the array of memory cells (126, 101, 158), and is not present in a peripheral region 200 located adjacent to the memory array region 100; and each of the first upper-level metal interconnect structures 664 and the second upper-level metal interconnect structures 666 comprises a respective metal line having a top surface within a horizontal plane including a topmost surface of the at least one upper-level dielectric layer (224, 226).

Figure 24:
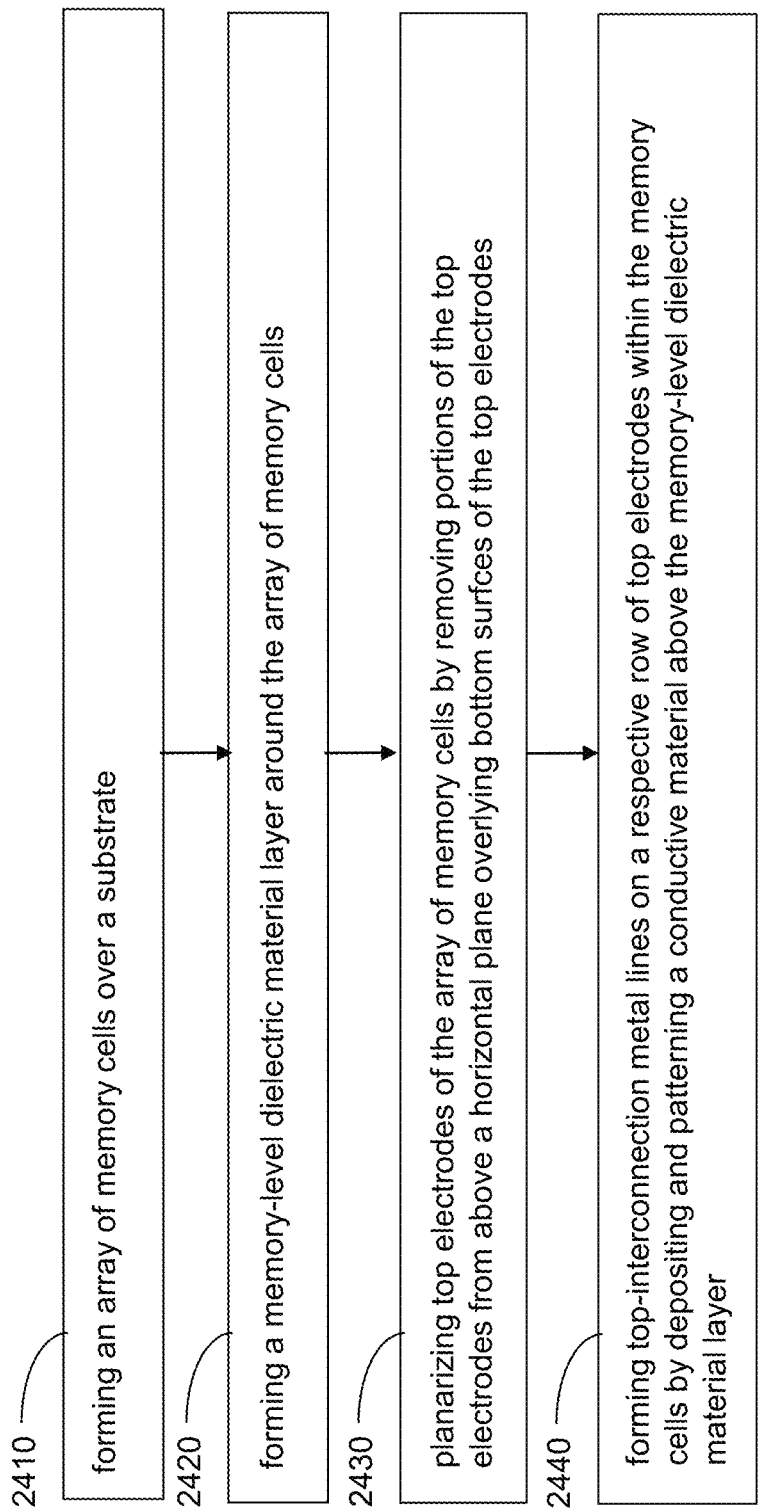
FIG. 24 is a flowchart that illustrates general processing steps of the methods of manufacturing a memory array device of the present disclosure.

Referring to FIG. 24, a flowchart illustrates general processing steps of the methods of manufacturing a memory array device of the present disclosure. Referring to step 2410 and FIGS. 1-5, an array of memory cells (126, 101, 158) is formed over a substrate 9 by depositing and patterning a memory material layer stack (130L, 140L, 146L, 148L), wherein each of the memory cells (126, 101, 158) comprises, from bottom to top, a bottom electrode 126, a memory element 101, and a top electrode 158. Referring to step 2420 and FIGS. 6-9, a memory-level dielectric layer 170 may be formed around the array of memory cells (126, 101, 158). Referring to step 2430 and FIGS. 10 and 11, top electrodes 158 of the array of memory cells (126, 101, 158) may be planarized by removing portions of the top electrodes 158 from above a horizontal plane located above bottom surfaces of the top electrodes 158. Referring to step 2440 and FIGS. 12, 13, and 18-21, top-interconnection metal lines 220 may be formed on a respective row of top electrodes 158 within the memory cells (126, 101, 158) by depositing and patterning a conductive material above the memory-level dielectric layer 170. Additional processing steps of FIGS. 14-19 and 21 may be subsequently performed.

The various embodiments of the present disclosure may be used to provide electrical connection to the top electrodes 158 of the memory cells (126, 101, 158) while eliminating, or minimizing, electrical short between the various components of the memory cells (126, 101, 158) and metal interconnect structures used to provide electrical connection to the top electrodes. The top-interconnection metal lines 220 is formed in a manner that eliminates, or reduces, downward protrusion below the horizontal plane including the top surface of the memory-level dielectric layer 170, and increases the process yield and the reliability of the contact structures, i.e., the top-interconnection metal lines 220, of the memory array device of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a memory array device, comprising;
   forming an array of memory cells over a substrate by depositing and patterning a memory material layer stack, wherein each of the memory cells comprises, from bottom to top, a bottom electrode, a memory element, and a top electrode;
   forming a memory-level dielectric layer around the array of memory cells;
   planarizing the top electrodes of the array of memory cells by removing portions of the top electrodes from above a horizontal plane located above bottom surfaces of the top electrodes; and
   forming top-interconnection metal lines by depositing and patterning a conductive material above the memory-level dielectric layer, wherein the top-interconnection metal lines are formed on, or replaces, a respective row of top electrodes within the memory cells.

2. The method of claim 1, further comprising:
   forming interconnect cavities in the memory-level dielectric layer;
   depositing at least one memory-level metallic material in the interconnect cavities and over the memory-level dielectric layer; and
   removing portions of the at least one memory-level metallic material from above the memory-level dielectric layer, wherein remaining portions of the at least one memory-level metallic material filling the interconnect cavities comprise memory-level metal interconnect structures.

3. The method of claim 2, further comprising:
   depositing a layer stack of an upper-level etch stop dielectric layer and at least one dielectric matrix layer over the memory-level dielectric layer;
   forming line cavities through the layer stack, wherein top surfaces of a respective row of top electrodes are physically exposed at a bottom of each of the line cavities; and
   wherein the top-interconnection metal lines are formed by depositing at least one connection-level metallic material in the line cavities.

4. The method of claim 2, further comprising:
   depositing at least one upper-level dielectric layer over the top-interconnection metal lines and the memory-level dielectric layer; and
   forming upper-level metal interconnect structures through the at least one upper-level dielectric layer.

5. The method of claim 4, wherein the upper-level metal interconnect structures comprise:
   first upper-level metal interconnect structures contacting a respective one of the top-interconnection metal lines; and
   second upper-level metal interconnect structures contacting a respective one of the memory-level metal interconnect structures.

6. The method of claim 1, further comprising forming an array of dielectric spacers around the array of memory cells, wherein the memory-level dielectric layer is formed around the array of dielectric spacers.

7. The method of claim 6, wherein portions of the array of dielectric spacers located above the horizontal plane including a planarized top surface of the memory-level dielectric layer are removed during planarization of the top electrodes of the array of memory cells.

8. The method of claim 1, further comprising:
depositing at least one dielectric matrix layer over the top electrode and the memory-level dielectric layer;
forming line cavities through the at least one dielectric matrix layer, wherein a respective row of top electrodes is physically exposed underneath of each of the line cavities; and
removing the top electrodes from underneath the line cavities.

9. The method of claim 8, further comprising depositing the conductive material in the line cavities and in volumes from which the top electrodes are removed, wherein each of the top-interconnection metal lines comprises a respective row of downward-protruding portions that fill volumes of the top electrodes and contact a respective row of memory elements.

10. A method of forming a memory array device, the method comprising:
forming an array of memory cells located over a substrate, wherein each of the memory cells comprises, from bottom to top, a bottom electrode, a memory element, and a top electrode;
forming a memory-level dielectric layer around the array of memory cells, wherein a top surface of the memory-level dielectric layer is formed within a horizontal plane including top surfaces of the top electrodes;
forming an upper-level etch stop dielectric layer over the memory-level dielectric layer;
forming a dielectric matrix layer over the upper-level etch stop dielectric layer;
forming top-interconnection metal lines over the array of memory cells, wherein each of the top-interconnection metal lines contacts, or replaces, a respective row of top electrodes;
forming a cap-level etch stop dielectric layer over the top-interconnection metal lines; and
patterning the cap-level etch stop dielectric layer and the dielectric matrix layer such that the cap-level etch stop dielectric layer has sidewalls that are vertically coincident with sidewalls of the dielectric matrix layer.

11. The method of claim 10, further comprising forming openings through the upper-level etch stop dielectric layer and the dielectric matrix layer, wherein:
the top-interconnection metal lines are formed in the openings through the upper-level etch stop dielectric layer and the dielectric matrix layer; and
the cap-level etch stop dielectric layer and the dielectric matrix layer are patterned by performing an anisotropic etch process that employs the upper-level etch stop dielectric layer as an etch stop structure.

12. The method of claim 10, wherein each of the top-interconnection metal lines is formed on top surfaces of the respective row of top electrodes that are located within a horizontal plane including a top surface of the memory-level dielectric layer.

13. The method of claim 12, further comprising:
forming a dielectric encapsulation structure around the array of memory cells; and
the top-interconnection metal lines are formed directly on the dielectric encapsulation structure within, or below, the horizontal plane including the top surface of the memory-level dielectric layer.

14. The method of claim 10, further comprising:
forming line cavities through the dielectric matrix layer and the upper-level etch stop dielectric layer; and
removing the top electrodes underneath the line cavities, wherein the top-interconnection metal lines fill volumes from which the top electrodes are removed.

15. The method of claim 10, further comprising forming an array of dielectric spacers around the array of memory cells, wherein the memory-level dielectric layer is formed around the array of dielectric spacers.

16. A method of forming a memory array device, the method comprising:
forming an array of memory cells located over a substrate, wherein each of the memory cells comprises, from bottom to top, a bottom electrode, a memory element, and a top electrode;
forming an array of dielectric spacers such that each of the dielectric spacers laterally surrounds a respective one of the memory cells;
forming a layer stack of an upper-level etch stop dielectric layer and at least one dielectric matrix layer over the array of memory cells; and
forming top-interconnection metal lines through the layer stack such that each of the top-interconnection metal lines contacts, or replaces, a respective row of top electrodes,
wherein bottom surfaces of the top-interconnection metal lines are formed below a horizontal plane including top surfaces of the dielectric spacers.

17. The method of claim 16, wherein the top-interconnection metal lines are formed on outer sidewalls of the array of dielectric spacers.

18. The method of claim 17, wherein the top-interconnection metal lines are formed on inner sidewalls of the array of dielectric spacers.

19. The method of claim 16, further comprising:
forming a dielectric encapsulation structure around the array of dielectric spacers; and
planarizing top surface of the top electrodes after formation of the dielectric encapsulation structure and prior to formation of the layer stack.

20. The method of claim 16, further comprising:
forming a memory-level dielectric layer around the array of memory cells; and
planarizing the top electrodes of the array of memory cells by removing portions of the top electrodes from above a horizontal plane located above bottom surfaces of the top electrodes, where the layer stack is formed above the memory-level dielectric layer after planarizing the top electrodes.

* * * * *